(12) United States Patent
Bae et al.

(10) Patent No.: US 11,849,570 B2
(45) Date of Patent: Dec. 19, 2023

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Byeong Ju Bae, Hwaseong-si (KR); Seung-Heon Lee, Seoul (KR); Ik Soo Kim, Yongin-si (KR); Byoung Deog Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 303 days.

(21) Appl. No.: 17/348,912

(22) Filed: Jun. 16, 2021

(65) Prior Publication Data

US 2022/0115442 A1 Apr. 14, 2022

(30) Foreign Application Priority Data

Oct. 14, 2020 (KR) .................. 10-2020-0132761

(51) Int. Cl.
*H10B 63/00* (2023.01)
*H10N 70/00* (2023.01)
*H10N 70/20* (2023.01)

(52) U.S. Cl.
CPC ............ *H10B 63/84* (2023.02); *H10B 63/24* (2023.02); *H10N 70/011* (2023.02); *H10N 70/231* (2023.02)

(58) Field of Classification Search
None
See application file for complete search history.

(56) References Cited

U.S. PATENT DOCUMENTS

| | | | |
|---|---|---|---|
| 5,936,295 A | 8/1999 | Havemann et al. | |
| 8,129,705 B2 * | 3/2012 | Kinoshita | H10N 70/826 257/E47.001 |
| 8,445,313 B2 | 5/2013 | Breitwisch et al. | |
| 8,765,573 B2 | 7/2014 | Mallick et al. | |
| 8,921,235 B2 | 12/2014 | Thadani et al. | |
| 8,940,632 B2 | 1/2015 | Nam | |
| 9,240,458 B2 | 1/2016 | Na et al. | |
| 9,502,643 B2 | 11/2016 | Bae et al. | |
| 10,396,125 B2 * | 8/2019 | Fantini | H10N 70/231 |
| 10,714,684 B2 * | 7/2020 | Cheng | H10N 70/231 |
| 2019/0067569 A1 | 2/2019 | Kang et al. | |
| 2019/0258166 A1 | 8/2019 | Otsuji | |

* cited by examiner

*Primary Examiner* — Mounir S Amer
(74) *Attorney, Agent, or Firm* — Muir Patent Law, PLLC

(57) ABSTRACT

A semiconductor memory device and associated methods, the device including first and second lower conductive lines extending in a first direction; a first middle conductive line on the first and second lower conductive lines and extending in a second direction; first and second memory cells between the first and second lower conductive lines and the first middle conductive line; an air gap support layer between the first and second memory cells; and a first air gap between the first and second memory cells and under the air gap support layer, wherein an upper surface of the air gap support layer lies in a same plane as the first and second memory cells, the first and second memory cells include first and second OTS layers and first and second phase-change layers, and the first air gap overlaps the first and second phase-change layers.

18 Claims, 39 Drawing Sheets

SEMICONDUCTOR MEMORY DEVICE AND METHOD OF FABRICATING THE SAME

CROSS-REFERENCE TO RELATED APPLICATION

Korean Patent Application No. 10-2020-0132761, filed on Oct. 14, 2020, in the Korean Intellectual Property Office, and entitled: "Semiconductor Memory Device and Method of Fabricating the Same," is incorporated by reference herein in its entirety.

BACKGROUND

1. Field

Embodiments relate to a semiconductor memory device and a method of fabricating the same

2. Description of the Related Art

As semiconductor memory devices increasingly become highly integrated, high-performance memory devices operating fast at low operating voltages have been considered. Recently, variable resistance memory devices having variable resistance characteristics have been considered. For example, phase-change random access memory (PRAM) devices, magnetic random access memory (MRAM) devices, and resistive random access memory (RRAM) devices have been considered as variable resistance memory devices.

SUMMARY

The embodiments may be realized by providing a semiconductor memory device including a first lower conductive line and a second lower conductive line each extending in a first direction and being spaced apart from each other in a second direction intersecting the first direction; a first middle conductive line on the first lower conductive line and the second lower conductive line and extending in the second direction; a first memory cell between the first lower conductive line and the first middle conductive line; a second memory cell between the second lower conductive line and the first middle conductive line; an air gap support layer between the first memory cell and the second memory cell; and a first air gap between the first memory cell and the second memory cell and under the air gap support layer, wherein an upper surface of the air gap support layer lies in a same plane as an upper surface of the first memory cell and an upper surface of the second memory cell, the first memory cell includes a first ovonic threshold switching (OTS) layer and a first phase-change layer, the second memory cell includes a second OTS layer and a second phase-change layer, and the first air gap overlaps the first phase-change layer and the second phase-change layer in the second direction.

The embodiments may be realized by providing a semiconductor memory device including a first lower conductive line and a second lower conductive line each extending in a first direction and being spaced apart from each other in a second direction intersecting the first direction; a first middle conductive line and a second middle conductive line on the first lower conductive line and the second lower conductive line, the first middle conductive line and the second middle conductive line each extending in the second direction and being spaced apart from each other in the first direction; a first memory cell between the first lower conductive line and the first middle conductive line; a second memory cell between the second lower conductive line and the first middle conductive line; a first air gap support layer between the first memory cell and the second memory cell; a first air gap between the first memory cell and the second memory cell and under the first air gap support layer; a second air gap between the first lower conductive line and the second lower conductive line; and a third air gap between the first middle conductive line and the second middle conductive line, wherein an upper surface of the first air gap support layer lies in a same plane as an upper surface of the first memory cell and an upper surface of the second memory cell, the first memory cell includes a first ovonic threshold switching (OTS) layer and a first phase-change layer, the second memory cell includes a second OTS layer and a second phase-change layer, and the first air gap overlaps the first and second phase-change layers in the second direction.

The embodiments may be realized by providing a method of fabricating a semiconductor memory device, the method including forming a first lower conductive line and a second lower conductive line extending in a first direction and being spaced apart from each other in a second direction intersecting the first direction; forming a first memory cell on the first lower conductive line; forming a second memory cell on the second lower conductive line; forming an insulating layer along profiles of the first memory cell and the second memory cell; forming a mold carbon layer on the insulating layer; forming an air gap support layer on the mold carbon layer; forming an air gap by removing the mold carbon layer by performing a heat treatment process; and forming a first middle conductive line and a second middle conductive line, which extend in the second direction and are spaced apart from each other in the first direction, on the first memory cell and the second memory cell, wherein the first memory cell includes a first ovonic threshold switching (OTS) layer and a first phase-change layer, the second memory cell includes a second OTS layer and a second phase-change layer, and the air gap is formed between the first memory cell and the second memory cell and overlaps the first phase-change layer and the second phase-change layer in the second direction.

BRIEF DESCRIPTION OF THE DRAWINGS

Features will be apparent to those of skill in the art by describing in detail exemplary embodiments with reference to the attached drawings in which.

DETAILED DESCRIPTION

A semiconductor memory device according to embodiments of the present disclosure will now be described with reference to FIGS. 1 through 3C.

Figure 1:
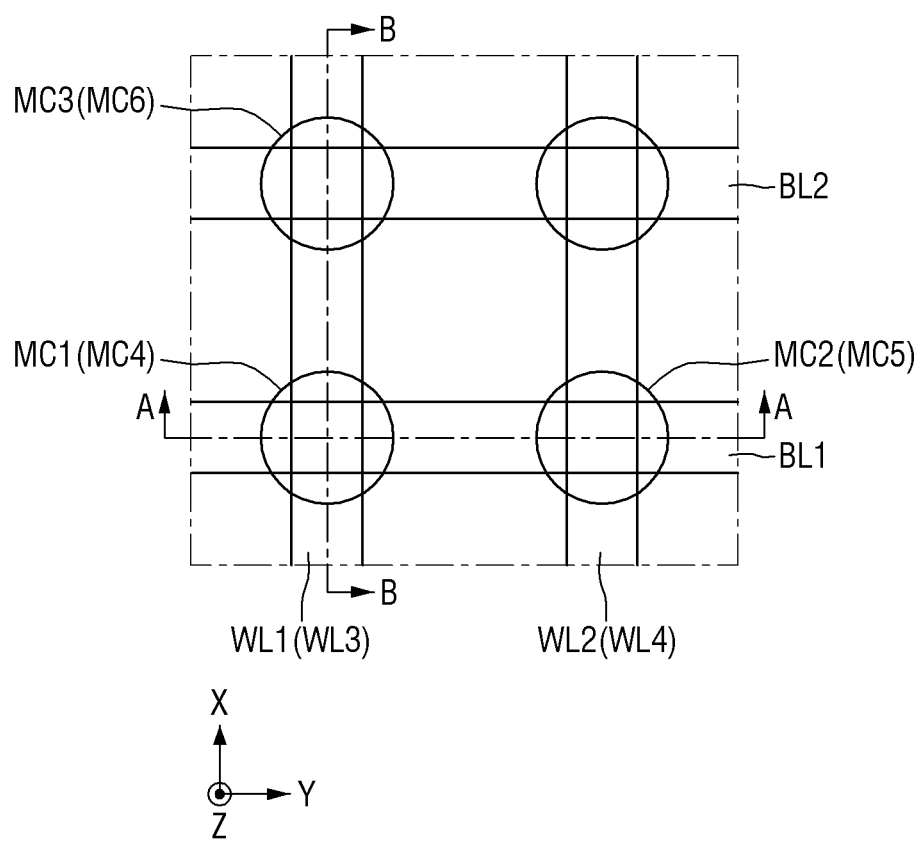
FIG. 1 is a layout view of a semiconductor memory device according to embodiments of the present disclosure.
Figure 2A:
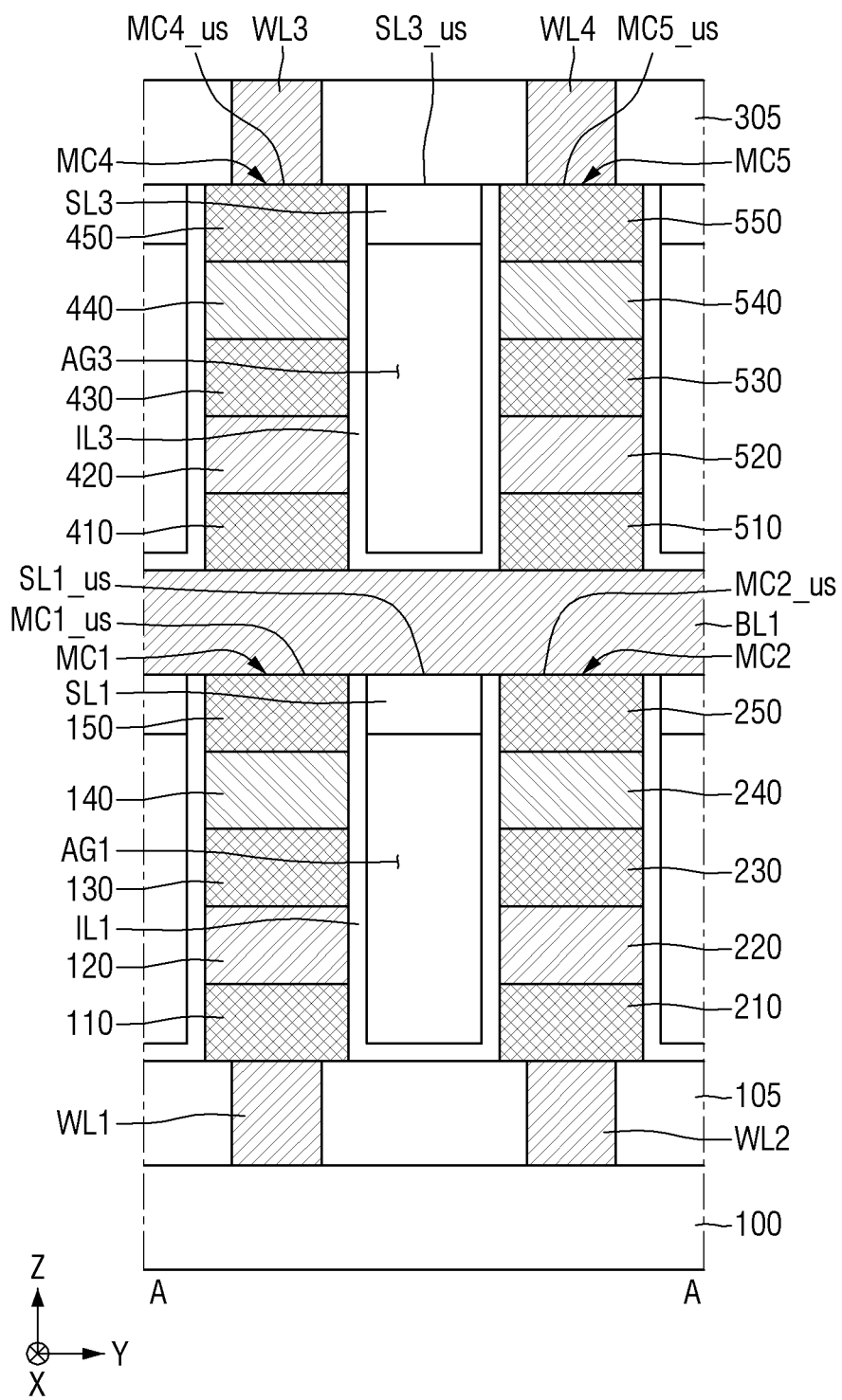
FIGS. 2A through 2C are cross-sectional views taken along line A-A of FIG. 1.
Figure 2B:
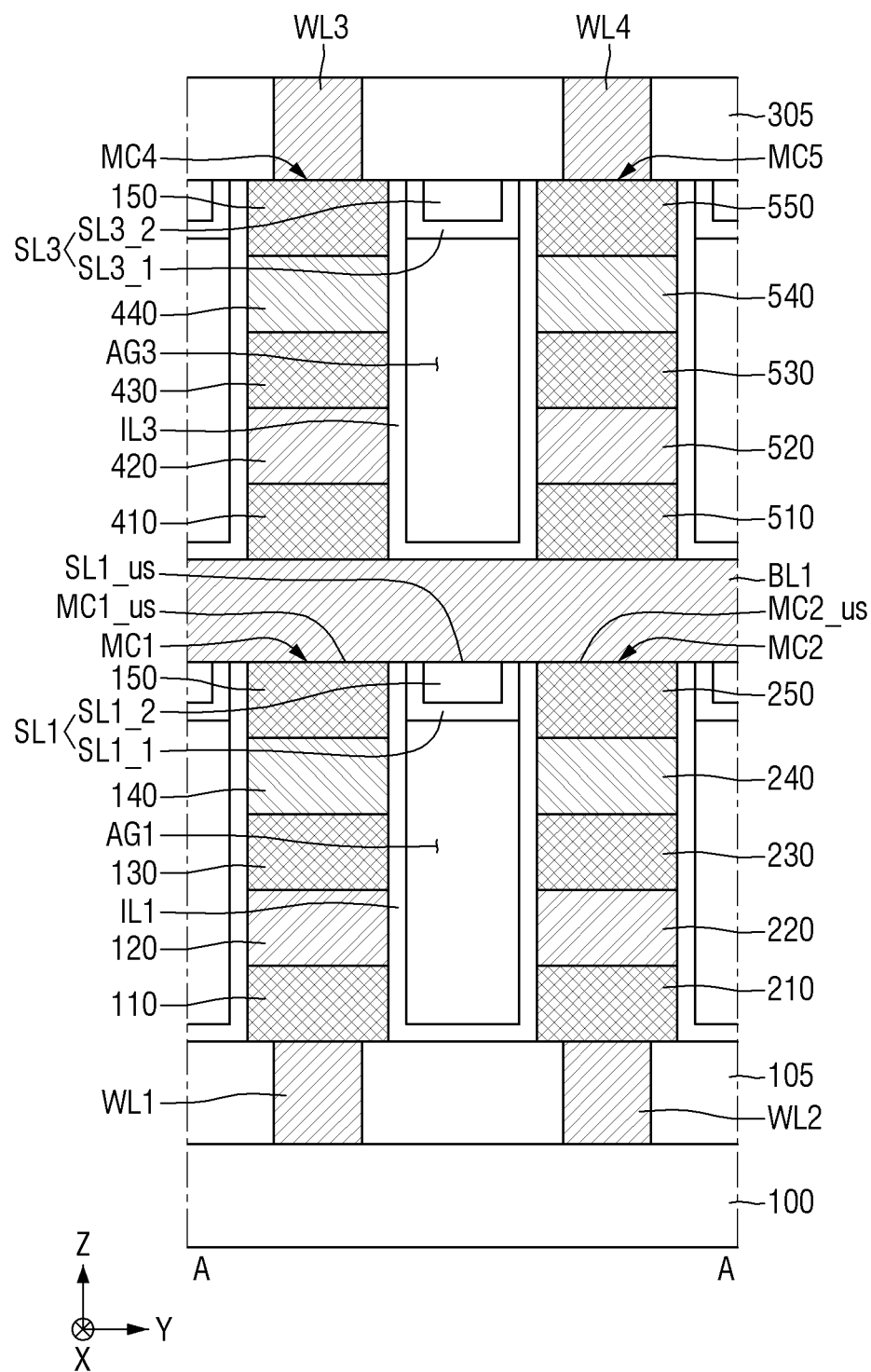
Figure 2C:
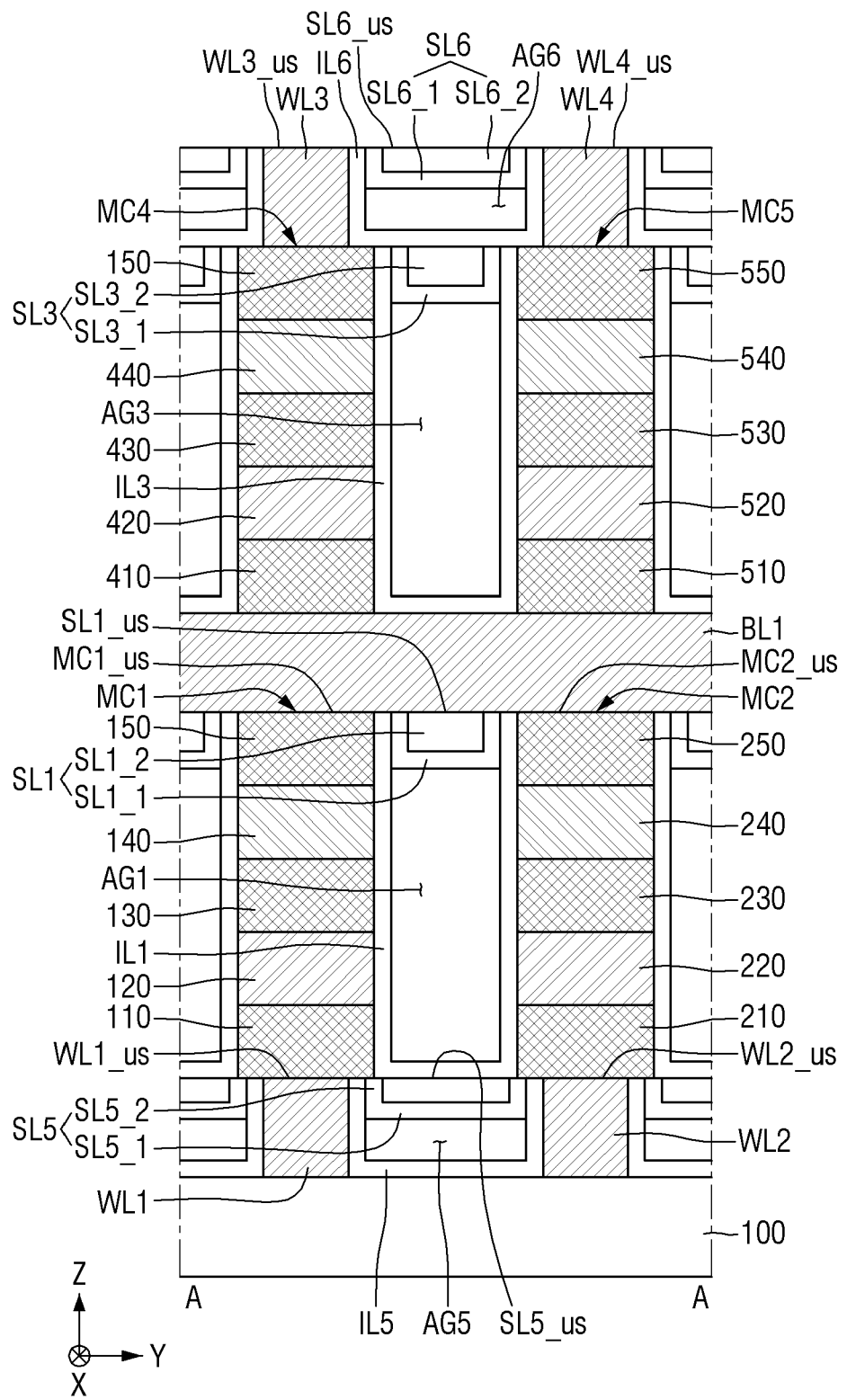
Figure 3A:
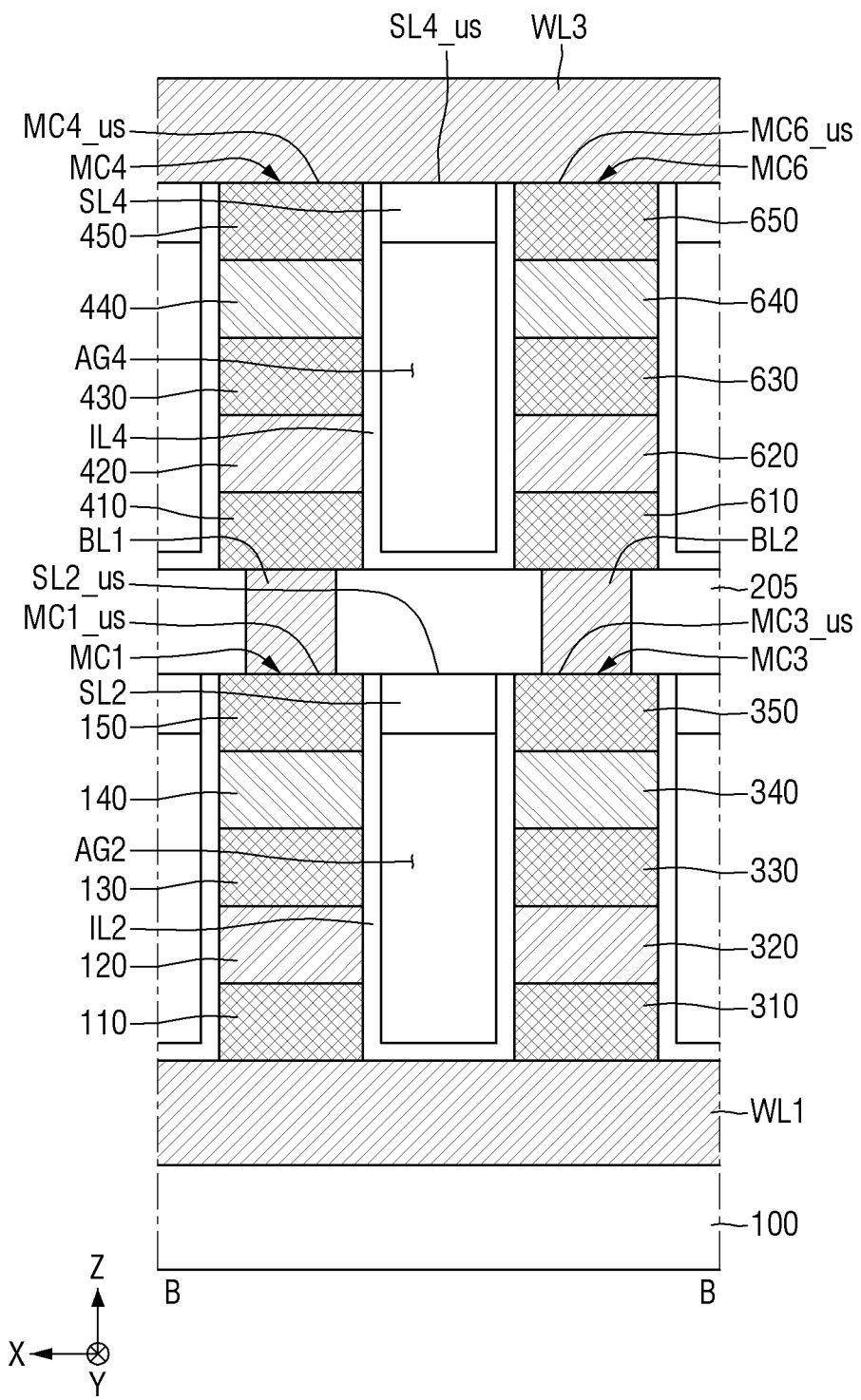
FIGS. 3A through 3C are cross-sectional views taken along line B-B of FIG. 1.
Figure 3B:
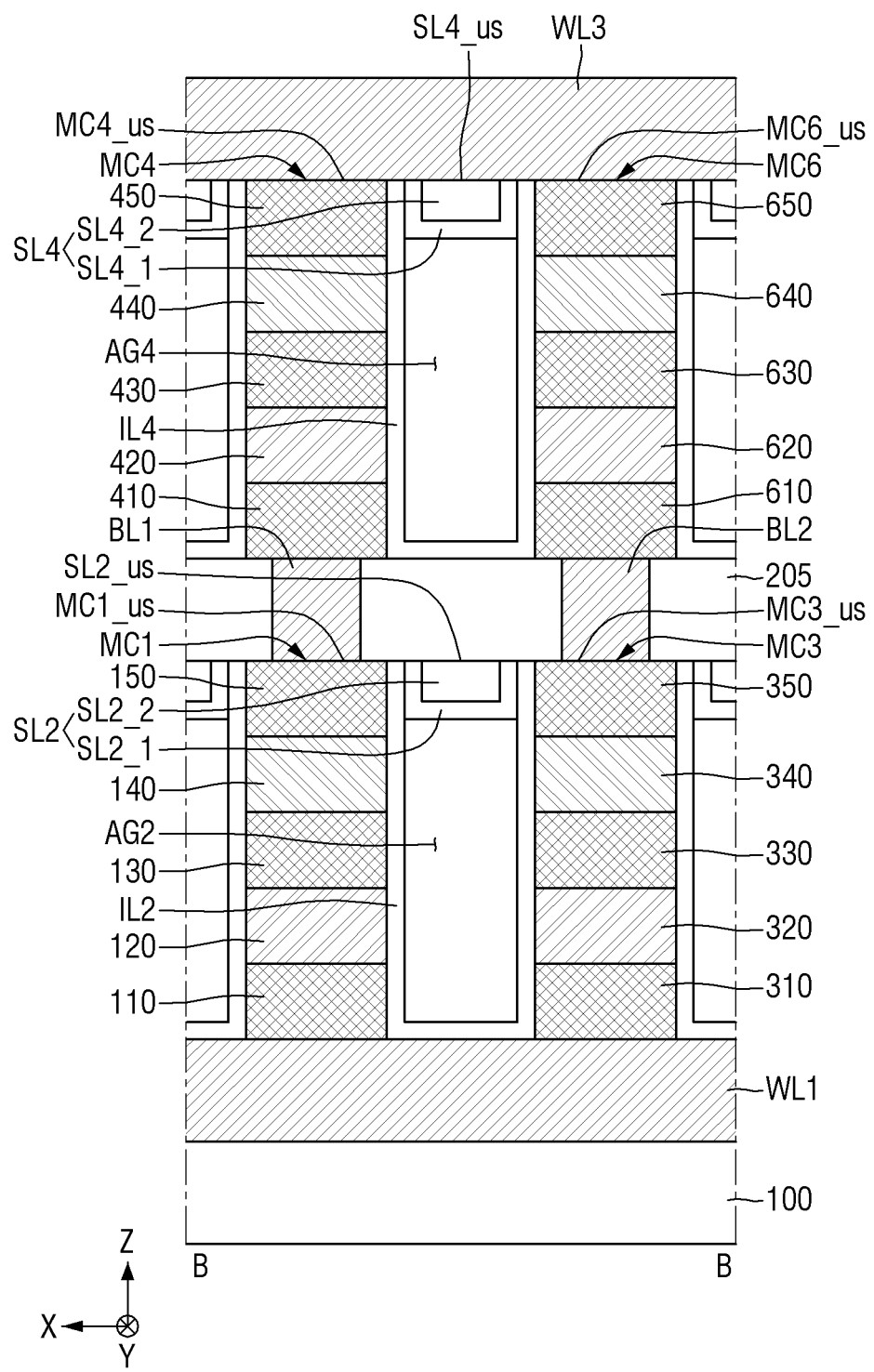
Figure 3C:
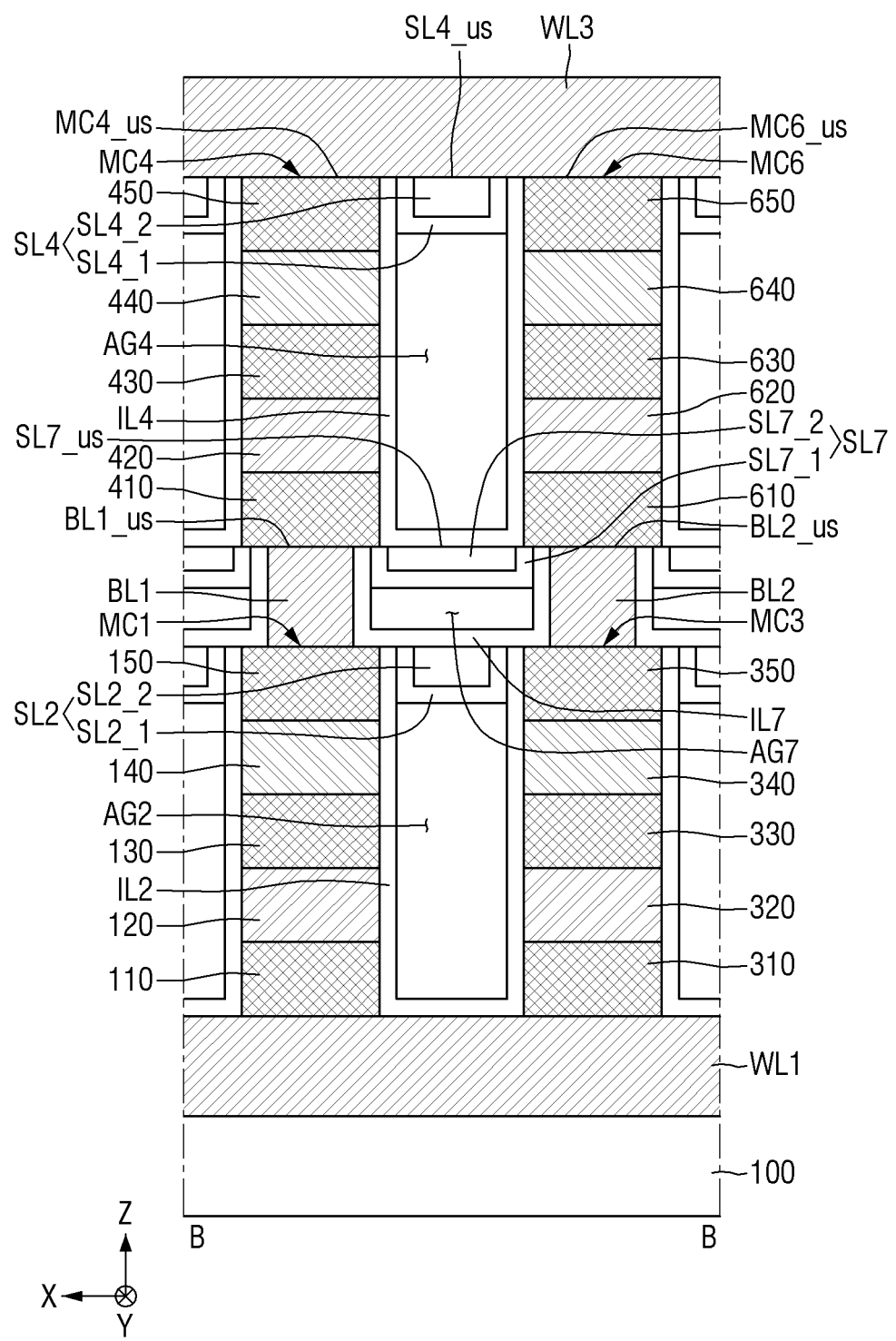

FIG. 1 is a layout view of a semiconductor memory device according to embodiments of the present disclosure. FIGS. 2A through 2C are cross-sectional views taken along line A-A of FIG. 1. FIGS. 3A through 3C are cross-sectional views taken along line B-B of FIG. 1.

Referring to FIGS. 1 through 3C, the semiconductor memory device according to the embodiments may include a substrate 100, a first lower conductive line WL1, a second lower conductive line WL2, a first middle conductive line BL1, a second middle conductive line BL2, a first upper conductive line WL3, a second upper conductive line WL4, and first through sixth memory cells MC1 through MC6.

The substrate 100 may be a semiconductor substrate. In an implementation, the substrate 100 may be bulk silicon or silicon-on-insulator (SOI). In an implementation, the substrate 100 may be a silicon substrate or a substrate made of another material such as silicon germanium, indium antimonide, lead telluride, indium arsenide, indium phosphide, gallium arsenide, or gallium antimonide. Alternatively, the substrate 100 may consist of a base substrate and an epitaxial layer formed on the base substrate. As used herein, the term "or" is not an exclusive term, e.g., "A or B" would include A, B, or A and B.

The first and second lower conductive lines WL1 and WL2 may be on the substrate 100. The first lower conductive line WL1 may extend (e.g., lengthwise) in a first direction X. The second lower conductive line WL2 may extend (e.g., lengthwise) in the first direction X and may be spaced apart from the first lower conductive line WL1 in a second direction Y. The first direction X and the second direction Y may intersect each other. In an implementation, the first direction X and the second direction Y may be perpendicular to each other.

The first and second middle conductive lines BL1 and BL2 may be on the first and second lower conductive lines WL1 and WL2 and spaced part from the first and second lower conductive lines WL1 and WL2 in a third direction Z. The third direction Z may intersect the first direction X and the second direction Y. In an implementation, the third direction Z may be perpendicular to the first direction X and the second direction Y.

The first middle conductive line BL1 may extend (e.g., lengthwise) in the second direction Y. The second middle conductive line BL2 may extend (e.g., lengthwise) in the second direction Y and may be spaced apart from the first middle conductive line BL1 in the first direction X.

The first upper conductive line WL3 may be on the first and second middle conductive lines BL1 and BL2 and spaced apart from the first and second middle conductive lines BL1 and BL2 in the third direction Z. The first upper conductive line WL3 may extend (e.g., lengthwise) in the first direction X. The second upper conductive line WL4 may extend (e.g., lengthwise) in the first direction X and may be spaced apart from the first upper conductive line WL3 in the second direction Y.

The first upper conductive line WL3 and the first lower conductive line WL1 may overlap in the third direction Z. The second upper conductive line WL4 and the second lower conductive line WL2 may overlap in the third direction Z.

The first upper conductive line WL3 and the first lower conductive line WL1 may completely overlap in the third direction Z. The second upper conductive line WL4 and the second lower conductive line WL2 may completely overlap in the third direction Z.

Each of the first and second lower conductive lines WL1 and WL2, the first and second middle conductive lines BL1 and BL2, and the first and second upper conductive lines WL3 and WL4 may include, e.g., tungsten (W), tungsten nitride (WN gold (Au), silver (Ag), copper (Cu) aluminum (Al), titanium aluminum nitride (TiAlN), nickel (Ni), cobalt (Co), chromium (Cr), tin (Sn), zinc (Zn), indium tin oxide (ITO), or combinations of the same.

The first and second lower conductive lines WL1 and WL2, the first and second middle conductive lines BL1 and BL2, and the first and second upper conductive lines WL3 and WL4 may include the same material or may include different materials.

In an implementation, each of the first and second lower conductive lines WL1 and WL2, the first and second middle conductive lines BL1 and BL2, and the first and second upper conductive lines WL3 and WL4 may include tungsten (W).

In an implementation, the first and second lower conductive lines WL1 and WL2 and the first and second upper conductive lines WL3 and WL4 may be word lines, and the first and second middle conductive lines BL1 and BL2 may be bit lines.

Interlayer insulating films 105, 205, and 305 may be on the substrate 100. The interlayer insulating film 105 may electrically insulate the first and second lower conductive lines WL1 and WL2. The interlayer insulating film 205 may electrically insulate the first and second middle conductive lines BL1 and BL2. The interlayer insulating film 305 may electrically insulate the first and second upper conductive lines WL3 and WL4. The interlayer insulating films 105, 205 and 305 may include, e.g., silicon oxide, silicon nitride, silicon oxynitride, or combinations of the same.

The memory cells MC1 through MC6 may be on the substrate 100. The first memory cell MC1 may be at an intersection of the first lower conductive line WL1 and the first middle conductive line BL1. The first memory cell MC1 may be between the first lower conductive line WL1 and the first middle conductive line BL1.

The second memory cell MC2 may be at an intersection of the second lower conductive line WL2 and the first middle conductive line BL1. The second memory cell MC2 may be between the second lower conductive line WL2 and the first middle conductive line BL1.

The third memory cell MC3 may be at an intersection of the first lower conductive line WL1 and the second middle conductive line BL2. The third memory cell MC3 may be between the first lower conductive line WL1 and the second middle conductive line BL2.

The fourth memory cell MC4 may be at an intersection of the first upper conductive line WL3 and the first middle conductive line BL1. The fourth memory cell MC4 may be between the first upper conductive line WL3 and the first middle conductive line BL1.

The fifth memory cell MC5 may be at an intersection of the second upper conductive line WL4 and the first middle conductive line BL1. The fifth memory cell MC5 may be between the second upper conductive line WL4 and the first middle conductive line BL1.

The sixth memory cell MC6 may be at an intersection of the first upper conductive line WL3 and the second middle conductive line BL2. The sixth memory cell MC6 may be between the first upper conductive line WL3 and the second middle conductive line BL2.

The first and second memory cells MC1 and MC2 may electrically connect the first and second lower conductive lines WL1 and WL2 to the first middle conductive line BL1, respectively.

The third memory cell MC3 may electrically connect the first lower conductive line WL1 and the second middle conductive line BL2.

The fourth and fifth memory cells MC4 and MC5 may electrically connect the first and second upper conductive lines WL3 and WL4 to the first middle conductive line BL1, respectively.

The sixth memory cell MC6 may electrically connect the first upper conductive line WL3 and the second middle conductive line BL2.

The first memory cell MC1 may be overlapped by the fourth memory cell MC4 in the third direction Z. The second memory cell MC2 may be overlapped by the fifth memory cell MC5 in the third direction Z. The third memory cell MC3 may be overlapped by the sixth memory cell MC6 in the third direction Z.

The first through sixth memory cells MC1 through MC6 may include first through sixth lower electrodes 110, 210, 310, 410, 510 and 610, respectively. The first through third lower electrodes 110, 210 and 310 may be on the first and second lower conductive lines WL1 and WL2. The fourth through sixth lower electrodes 410, 510 and 610 may be on the first and second middle conductive lines BL1 and BL2.

The first and third lower electrodes 110 and 310 may be electrically connected to the first lower conductive line WL1 by contacting (e.g., directly contacting) the first lower conductive line WL1. Each of the fourth and fifth lower electrodes 410 and 510 may be electrically connected to the first middle conductive line BL1 by contacting (e.g., directly contacting) the first middle conductive line BL1. The second lower electrode 210 may be electrically connected to the second lower conductive line WL2 by contacting (e.g., directly contacting) the second lower conductive line WL2. The sixth lower electrode 610 may be electrically connected to the second middle conductive line BL2 by contacting (e.g., directly contacting) the second middle conductive line BL2.

The first through sixth memory cells MC1 through MC6 may include first through sixth middle electrodes 130, 230, 330, 430, 530 and 630, respectively. The first through sixth middle electrodes 130, 230, 330, 430, 530 and 630 may be on the first through sixth lower electrodes 110, 210, 310, 410, 510 and 610, respectively.

The first through sixth memory cells MC1 through MC6 may include first through sixth upper electrodes 150, 250, 350, 450, 550 and 650, respectively. The first through sixth upper electrodes 150, 250, 350, 450, 550 and 650 may be on the first through sixth middle electrodes 130, 230, 330, 430, 530 and 630, respectively.

The first and second upper electrodes 150 and 250 may be electrically connected to the first middle conductive line BL1 by contacting (e.g., directly contacting) the first middle conductive line BL1. The third upper electrode 350 may be electrically connected to the second middle conductive line BL2 by contacting (e.g., directly contacting) the second middle conductive line BL2. The fourth and sixth upper electrodes 450 and 650 may be electrically connected to the first upper conductive line WL3 by contacting (e.g., directly contacting) the first upper conductive line WL3. The fifth upper electrode 550 may be electrically connected to the second upper conductive line WL4 by contacting (e.g., directly contacting) the second upper conductive line WL4.

Each of the first through sixth lower electrodes 110, 210, 310, 410, 510 and 610, the first through sixth middle electrodes 130, 230, 330, 430, 530 and 630, and the first through sixth upper electrodes 150, 250, 350, 450, 550 and 650 may include a metal or a metal nitride, e.g., tungsten (W), platinum (Pt), palladium (Pd), rhodium (Rh), ruthenium (Ru), iridium (Ir), copper (Cu), aluminum (Al), titanium (Ti) or tantalum (Ta), titanium nitride (TiN), or a combination of the same. In an implementation, the first through sixth lower electrodes 110, 210, 310, 410, 510 and 610, the first through sixth middle electrodes 130, 230, 330, 430, 530 and 630, and the first through sixth upper electrodes 150, 250, 350, 450, 550 and 650 may include a carbon (C) layer.

The first through sixth memory cells MC1 through MC6 may include first through sixth ovonic threshold switching (OTS) layers 120, 220, 320, 420, 520 and 620, respectively.

In an implementation, the first through sixth OTS layers 120, 220, 320, 420, 520 and 620 may be between the first through sixth lower electrodes 110, 210, 310, 410, 510 and 610 and the first through sixth middle electrodes 130, 230, 330, 430, 530 and 630, respectively.

The first through sixth OTS layers 120, 220, 320, 420, 520 and 620 may help control current flows in the first through sixth memory cells MC1 through MC6, respectively.

In an implementation, the first through sixth OTS layers 120, 220, 320, 420, 520 and 620 may have OTS characteristics. In an implementation, when the first through sixth OTS layers 120, 220, 320, 420, 520 and 620 are in an OFF state (high resistance state), if a voltage equal to or higher than a specific voltage (threshold switching voltage) is applied to the first through sixth OTS layers 120, 220, 320, 420, 520 and 620, the first through sixth OTS layers 120, 220, 320, 420, 520 and 620 may be changed to an ON state (low resistance state).

In an implementation, when the first through sixth OTS layers 120, 220, 320, 420, 520 and 620 are in the ON state (low resistance state), if the voltage applied to the first through sixth OTS layers 120, 220, 320, 420, 520 and 620 is lowered to a specific voltage (sustain voltage) or less, the first through sixth OTS layers 120, 220, 320, 420, 520 and 620 may be restored to the OFF state (high resistance state).

The first through sixth OTS layers 120, 220, 320, 420, 520 and 620 may include, e.g., a chalcogenide material. The chalcogenide material may include a compound including a combination of S, The, or Se, which are chalcogen elements, and Ge, Sb, Bi, Al, Tl, Sn, Zn, As, Si, In, Ti, Ga, or P.

In an implementation, the first through sixth OTS layers 120, 220, 320, 420, 520 and 620 may include, e.g., GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn.

The first through sixth memory cells MC1 through MC6 may include the first through sixth phase-change layers 140, 240, 340, 440, 540 and 640, respectively.

In an implementation, the first through sixth phase-change layers 140, 240, 340, 440, 540 and 640 may be between the first through sixth middle electrodes 130, 230, 330, 430, 530 and 630 and the first through sixth upper electrodes 150, 250, 350, 450, 550 and 650, respectively. In an implementation, the first through sixth phase-change layers 140, 240, 340, 440, 540 and 640 may swap places with the first through sixth OTS layers 120, 220, 320, 420, 520 and 620, respectively.

The first through sixth phase-change layers 140, 240, 340, 440, 540 and 640 may electrically connect the first through sixth middle electrodes 130, 230, 330, 430, 530 and 630 and the first through sixth upper electrodes 150, 250, 350, 450, 550 and 650, respectively. The first through sixth phase-change layers 140, 240, 340, 440, 540 and 640 may be phase-change patterns. In an implementation, the first through sixth phase-change layers 140, 240, 340, 440, 540 and 640 may store data by changing their resistance according to a temperature change.

The first through sixth phase-change layers 140, 240, 340, 440, 540 and 640 may include a compound including a combination of, e.g., S, Te, or Se, which are chalcogen elements, and Ge, Sb, Bi, Sn, Ag, As, Si, In, Ga, Ce, Y, Al, Tl, Nd, Dy, Sc, or Zn.

In an implementation, the first through sixth phase-change layers 140, 240, 340, 440, 540 and 640 may include, e.g., GeTe, GeSe, GeS, SbSe, SbTe, SbS, SbSe, SnSb, InSe, InSb, AsTe, AlTe, GaSb, AlSb, BiSb, ScSb, YSb, CeSb, DySb, NdSb, GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTem ScSbTe, ScSbSe, ScSbS, TSbTe, TSbSe, TSbS, CeSbTe, CeSbSe, CeSbS, DySbTe, DySbSe, DySbS, NdSbTe, NdSbSe, NdSbS, GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, NdGeSbS, InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSb SeAlSn, GeSbSeTlZn, GeSbSeTlSn, or GeSbSeZnSn.

In an implementation, the first through sixth phase-change layers 140, 240, 340, 440, 540 and 640 may include GeSbTe (GST).

Referring to FIGS. 2A through 2C, the first memory cell MC1 and the second memory cell MC2 may be spaced apart from each other in the second direction Y.

A first air gap AG1 may be between the first memory cell MC1 and the second memory cell MC2. The first air gap AG1 may electrically insulate the first memory cell MC1 and the second memory cell MC2. The first air gap AG1 may be under a first air gap support layer SL1 (e.g., the first air gap AG1 may be between the substrate 100 and the first air gap support layer SL1 in the third direction Z).

In an implementation, the first air gap AG1 may overlap the first and second phase-change layers 140 and 240 in the second direction Y. In an implementation, the first air gap AG1 may completely overlap the first and second phase-change layers 140 and 240 in the second direction Y. In an implementation, at least part of sidewalls of the first and second upper electrodes 150 and 250 may overlap the first air gap support layer SL1 in the second direction Y. In an implementation, the first air gap AG1 may be between the first and second phase-change layers 140 and 240 in the second direction Y. In an implementation, the first air gap AG1 may completely cover sides of the first and second phase-change layers 140 and 240 in the second direction Y. In an implementation, at least part of sidewalls of the first and second upper electrodes 150 and 250 may be covered by the first air gap support layer SL1 in the second direction Y.

The first air gap support layer SL1 may be on the first air gap AG1 to overlap the first air gap AG1 in the third direction Z. The first air gap support layer SL1 may be between the first memory cell MC1 and the second memory cell MC2. The first air gap support layer SL1 may help support the first middle conductive line BL1 on the first air gap support layer SL1.

An upper surface MC1_us (e.g., surface facing away from the substrate 100 in the third direction Z) of the first memory cell MC1, an upper surface MC2_us of the second memory cell MC2, and an upper surface SL1_us of the first air gap support layer SL1 may lie in the same plane (e.g., may be coplanar).

The first air gap support layer SL1 may include, e.g., silicon oxide (SiO), silicon nitride (SiN), silicon carbide (SiC), SiOC, SiCN, or SiBN.

A first insulating layer IL1 may be between the first air gap AG1 and the first and second memory cells MC1 and MC2. The first insulating layer IL1 may be along profiles of the first memory cell MC1, the second memory cell MC2, and the interlayer insulating film 105. For example, the first insulating layer IL1 may be conformally formed on surfaces of the first memory cell MC1, the second memory cell MC2, and the interlayer insulating film 105.

In an implementation, the first insulating layer IL1 may be along profiles of the first memory cell MC1, the second memory cell MC2, and a fifth air gap support layer SL5.

The first insulating layer IL1 may overlap the first and second OTS layers 120 and 220 in the second direction Y. The first insulating layer IL1 may include, e.g., silicon nitride (SiN).

The fourth memory cell MC4 and the fifth memory cell MC5 may be on the first middle conductive line BL1. The fourth memory cell MC4 and the fifth memory cell MC5 may overlap the first memory cell MC1 and the second memory cell MC2 in the third direction Z, respectively. The fourth memory cell MC4 and the fifth memory cell MC5 may be spaced apart from each other in the second direction Y.

A third air gap AG3 may be between the fourth memory cell MC4 and the fifth memory cell MC5. The third air gap AG3 may electrically insulate the fourth memory cell MC4 and the fifth memory cell MC5. The third air gap AG3 may be under a third air gap support layer SL3.

In an implementation, the third air gap AG3 may overlap the first air gap AG1 in the third direction Z. The third air gap AG3 may overlap the fourth and fifth phase-change layers 440 and 540 in the second direction Y. In an implementation, the third air gap AG3 may completely overlap the fourth and fifth phase-change layers 440 and 540 in the second direction Y. In an implementation, at least part of sidewalls of the fourth and fifth upper electrodes 450 and 550 may overlap the third air gap support layer SL3 in the second direction Y.

The third air gap support layer SL3 may be on the third air gap AG3. The third air gap support layer SL3 may be between the fourth memory cell MC4 and the fifth memory cell MC5.

In an implementation, the third air gap support layer SL3 may support the interlayer insulating film 305 on the third air gap support layer SL3. In an implementation, the third air gap support layer SL3 may support a sixth insulating layer IL6 on the third air gap support layer SL3, a sixth air gap AG6, and a sixth air gap support layer SL6.

An upper surface SL3_us of the third air gap support layer SL3 may lie in the same plane as an upper surface MC4_us of the fourth memory cell MC4 and an upper surface MC5_us of the fifth memory cell MC5.

The third air gap support layer SL3 may include, e.g., silicon oxide (SiO), silicon nitride (SiN), silicon carbide (SiC), SiOC, SiCN, or SiBN.

A third insulating layer IL3 may be between the third air gap AG3 and the fourth and fifth memory cells MC4 and MC5. The third insulating layer IL3 may be along profiles of the fourth memory cells MC4, the fifth memory cells MC5, and the first middle conductive line BL1.

The third insulating layer IL3 may overlap the fourth and fifth OTS layers 420 and 520 in the second direction Y. The third insulating layer IL3 may include, e.g., silicon nitride (SiN).

Referring to FIG. 2B, in some embodiments, the first and third air gap support layers SL1 and SL3 may be multilayers.

Since the third air gap support layer SL3 may be substantially the same as the first air gap support layer SL1, only the first air gap support layer SL1 will be described below.

The first air gap support layer SL1 may include a $(1\_1)^{th}$ air gap support layer SL1_1 (e.g., first air gap support sub-layer) and a $(1\_2)^{th}$ air gap support layer SL1_2 (e.g., second air gap support sub-layer) on the $(1\_1)^{th}$ air gap support layer SL1_1. The $(1\_1)^{th}$ air gap support layer SL1_1 may be along profiles of the first insulating layer IL1 and the first air gap AG1.

The $(1\_1)^{th}$ air gap support layer SL1_1 and the $(1\_2)^{th}$ air gap support layer SL1_2 may be made of different materials. In an implementation, the $(1\_1)^{th}$ air gap support layer SL1_1 may include, e.g., silicon oxide (SiO), silicon nitride (SiN), silicon carbide (SiC), SiOC, SiCN, or SiBN. The $(1\_2)^{th}$ air gap support layer SL1_2 may include, e.g., silicon oxide (SiO), silicon nitride (SiN), silicon carbide (SiC), SiOC, SiCN, or SiBN.

Referring to FIG. 2C, in some embodiments, a fifth air gap AG5 may be between the first and second lower conductive lines WL1 and WL2. The sixth air gap AG6 may be between the first and second upper conductive lines WL3 and WL4.

The fifth air gap AG5 may electrically insulate the first lower conductive line WL1 and the second lower conductive line WL2. Likewise, the sixth air gap AG6 may electrically insulate the first upper conductive line WL3 and the second upper conductive line WL4.

The fifth air gap support layer SL5 and the sixth air gap support layer SL6 may be on the fifth air gap AG5 and the sixth air gap AG6, respectively. The fifth air gap support layer SL5 may support the first insulating layer IL1, the first air gap AG1, and the first air gap support layer SL1.

An upper surface SL5_us of the fifth air gap support layer SL5 may lie in substantially the same plane as an upper surface WL1_us of the first lower conductive line WL1 and an upper surface WL2_us of the second lower conductive line WL2.

An upper surface SL6_us of the sixth air gap support layer SL6 may lie in substantially the same plane as an upper surface WL3_us of the first upper conductive line WL3 and an upper surface WL4_us of the second upper conductive line WL4.

Since the fifth air gap AG5 and the fifth air gap support layer SL5 may be substantially the same as the sixth air gap AG6 and the sixth air gap support layer SL6, respectively, only the fifth air gap AG5 and the fifth air gap support layer SL5 will be described below.

The fifth air gap AG5 may be under the fifth air gap support layer SL5. The fifth air gap AG5 may be overlapped by the first air gap AG1 and the third air gap AG3 in the third direction Z.

In an implementation, the fifth air gap support layer SL5 may be a multilayer. The fifth air gap support layer SL5 may include a $(5\_1)^{th}$ air gap support layer SL5_1 and a $(5\_2)^{th}$ air gap support layer SL5_2 on the $(5\_1)^{th}$ air gap support layer SL5_1.

The $(5\_1)^{th}$ air gap support layer SL5_1 and the $(5\_2)^{th}$ air gap support layer SL5_2 may be different materials. In an implementation, the $(5\_1)^{th}$ and $(5\_2)^{th}$ air gap support layers SL5_1 and SL5_2 may include, e.g., silicon oxide (SiO), silicon nitride (SiN), silicon carbide (SiC), SiOC, SiCN, or SiBN.

In an implementation, the fifth air gap support layer SL5 may be a single layer. In this case, the $(5\_1)^{th}$ air gap support layer SL5_1 and the $(5\_2)^{th}$ air gap support layer SL5_2 may be the same material.

A fifth insulating layer IL5 may be between the first and second lower conductive lines WL1 and WL2 and the fifth air gap AG5. The fifth insulating layer IL5 may be along profiles of the first lower conductive line WL1, the second lower conductive line WL2, and the substrate 100.

The sixth insulating layer IL6 may be between the first and second upper conductive lines WL3 and WL4 and the sixth air gap AG6. The sixth insulating layer IL6 may be along profiles of the first upper conductive line WL3, the second upper conductive line WL4, and the third air gap support layer SL3.

The fifth and sixth insulating layers IL5 and IL6 may include, e.g., silicon nitride (SiN).

Referring to FIGS. 3A through 3C, the first memory cell MC1 and the third memory cell MC3 may be spaced apart from each other in the first direction X.

A second air gap AG2 may be between the first memory cell MC1 and the third memory cell MC3. The second air gap AG2 may electrically insulate the first memory cell MC1 and the third memory cell MC3. The second air gap AG2 may be disposed under a second air gap support layer SL2.

The second air gap AG2 may overlap (e.g., may be between) the first and third phase-change layers 140 and 340 in the first direction X. In an implementation, the second air gap AG2 may completely overlap (e.g., may completely cover facing sidewalls of) the first and third phase-change layers 140 and 340 in the first direction X. In an implementation, at least part of sidewalls of the first and third upper electrodes 150 and 350 may overlap the second air gap support layer SL2 in the first direction X.

The second air gap support layer SL2 may be on the second air gap AG2 and may overlap the second air gap AG2 in the third direction Z. The second air gap support layer SL2 may support the interlayer insulating film 205 on the second air gap support layer SL2.

In an implementation, the second air gap support layer SL2 may support a seventh insulating layer IL7 on the second air gap support layer SL2, a seventh air gap AG7, and a seventh air gap support layer SL7.

The upper surface MC1_us of the first memory cell MC1, an upper surface MC3_us of the third memory cell MC3, and an upper surface SL2_us of the second air gap support layer SL2 may lie in the same plane.

The second air gap support layer SL2 may include, e.g., silicon oxide (SiO), silicon nitride (SiN), silicon carbide (SiC), SiOC, SiCN, or SiBN.

A second insulating layer IL2 may be between the second air gap AG2 and the first and third memory cells MC1 and MC3. The second insulating layer IL2 may be along profiles of the first memory cell MC1, the third memory cell MC3, and the first lower conductive line WL1. The second insulating layer IL2 may overlap the first and third OTS layers 120 and 320 in the first direction X. The second insulating layer IL2 may include, e.g., silicon nitride (SiN).

The fourth memory cell MC4 and the sixth memory cell MC6 may be on the first and second middle conductive lines BL1 and BL2, respectively. The fourth memory cell MC4 and the sixth memory cell MC6 may overlap the first memory cell MC1 and the third memory cell MC3 in the third direction Z, respectively. The fourth memory cell MC4 and the sixth memory cell MC6 may be spaced apart from each other in the first direction X.

A fourth air gap AG4 may be between the fourth memory MC4 and the sixth memory cell MC6. The fourth air gap AG may electrically insulate the fourth memory cell MC4 and the sixth memory cell MC6. The fourth air gap AG4 may be under a fourth air gap support layer SL4.

The fourth air gap AG4 may overlap the second air gap AG2 in the third direction Z. The fourth air gap AG4 may overlap the fourth and sixth phase-change layers 440 and 640 in the first direction X. In an implementation, the fourth air gap AG4 may completely overlap the fourth and sixth phase-change layers 440 and 640 in the first direction X. In an implementation, at least part of sidewalls of the fourth and sixth upper electrodes 450 and 650 may overlap the fourth air gap support layer SL4 in the first direction X.

The fourth air gap support layer SL4 may be on the fourth air gap AG4. The fourth air gap support layer SL4 may support the first upper conductive line WL3. An upper surface SL4_us of the fourth air gap support layer SL4 may lie in the same plane as the upper surface MC4_us of the fourth memory cell MC4 and an upper surface MC6_us of the sixth memory cell MC6.

The fourth air gap support layer SL4 may include, e.g., silicon oxide (SiO), silicon nitride (SiN), silicon carbide (SiC), SiOC, SiCN, or SiBN.

A fourth insulating layer IL4 may be between the fourth air gap AG4 and the fourth and sixth memory cells MC4 and MC6. The fourth insulating layer IL4 may be along profiles of the fourth memory cells MC4, the sixth memory cells MC6, and the interlayer insulating film 205.

In an implementation, the fourth insulating layer IL4 may be along profiles of the fourth memory cell MC4, the sixth memory cell MC6, and the seventh air gap support layer SL7. The fourth insulating layer IL4 may overlap the fourth and sixth OTS layers 420 and 620 in the first direction X. The fourth insulating layer IL4 may include, e.g., silicon nitride (SiN).

Referring to FIG. 3B, in some embodiments, the second air gap support layer SL2 and the fourth air gap support layer SL4 may be multilayers.

Since the fourth air gap support layer SL4 may be substantially the same as the second air gap support layer SL2, only the second air gap support layer SL2 will be described below.

The second air gap support layer SL2 may include a $(2\_1)^{th}$ air gap support layer SL2_1 and a $(2\_2)^{th}$ air gap support layer SL2_2 on the $(2\_1)^{th}$ air gap support layer SL2_1. The $(2\_1)^{th}$ air gap support layer SL2_1 may be along profiles of the second insulating layer IL2 and the second air gap AG2.

The $(2\_1)^{th}$ air gap support layer SL2_1 and the $(2\_2)^{th}$ air gap support layer SL2_2 may be made of different materials. In an implementation, the $(2\_1)^{th}$ air gap support layer SL2_1 may include, e.g., silicon oxide (SiO), silicon nitride (SiN), silicon carbide (SiC), SiOC, SiCN, or SiBN. The $(2\_2)^{th}$ air gap support layer SL2_2 may include, e.g., silicon oxide (SiO), silicon nitride (SiN), silicon carbide (SiC), SiOC, SiCN, or SiBN.

Referring to FIG. 3C, in some embodiments, the seventh air gap AG7 may be between the first middle conductive line BL1 and the second middle conductive line BL2.

The seventh air gap AG7 may electrically insulate the first middle conductive line BL1 and the second middle conductive line BL2. The seventh air gap AG7 may overlap the second air gap AG2 and the fourth air gap AG4 in the third direction Z.

The seventh air gap support layer SL7 may be on the seventh air gap AG7. The seventh air gap support layer SL7 may support the fourth insulating layer IL4, the fourth air gap AG4, and the fourth air gap support layer SL4.

An upper surface SL7_us of the seventh air gap support layer SL7 may lie in substantially the same plane as an upper surface BL1_us of the first middle conductive line BL1 and an upper surface BL2_us of the second middle conductive line BL2.

In an implementation, the seventh air gap support layer SL7 may be a multilayer. In an implementation, the seventh air gap support layer SL7 may include a $(7\_1)^{th}$ air gap support layer SL7_1 and a $(7\_2)^{th}$ air gap support layer SL7_2 on the $(7\_1)^{th}$ air gap support layer SL7_1.

The $(7\_1)^{th}$ air gap support layer SL7_1 may be along profiles of the first and second middle conductive lines BL1 and BL2 and the second air gap support layer SL2.

The $(7\_1)^{th}$ air gap support layer SL7_1 and the $(7\_2)^{th}$ air gap support layer SL7_2 may be different materials. In an implementation, the $(7\_1)^{th}$ air gap support layer SL7_1 and the $(7\_2)^{th}$ air gap support layer SL7_2 may include, e.g., silicon oxide (SiO), silicon nitride (SiN), silicon carbide (SiC), SiOC, SiCN, or SiBN.

In an implementation, the seventh air gap support layer SL7 may be a single layer. In this case, the $(7\_1)^{th}$ air gap support layer SL7_1 and the $(7\_2)^{th}$ air gap support layer SL7_2 may be the same material.

A method of fabricating a semiconductor memory device according to embodiments of the present disclosure will now be described with reference to FIGS. 4 through 39.

Figure 4:
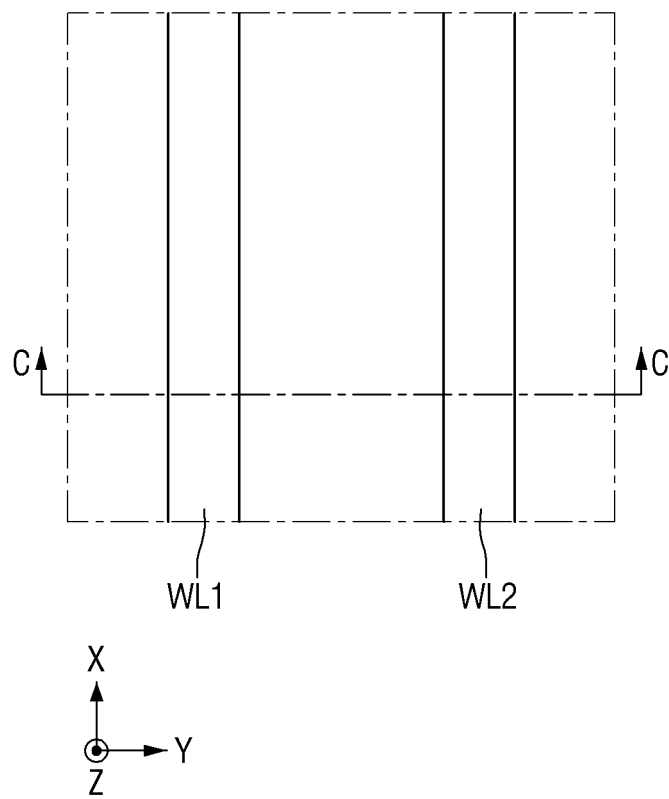
FIGS. 4 through 11 are views of stages in a method of fabricating a semiconductor memory device according to embodiments of the present disclosure.
Figure 5:
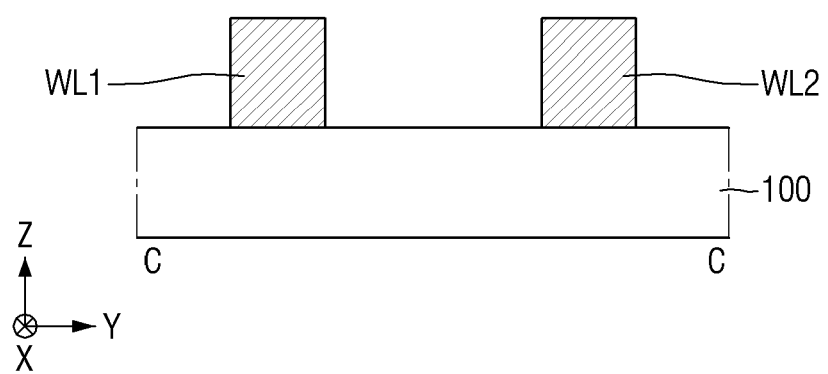

FIGS. 4 through 11 are views of stages in a method of fabricating a semiconductor memory device according to embodiments of the present disclosure. FIG. 4 is a layout view of a stage in the method of fabricating a semiconductor memory device according to the embodiments. FIG. 5 is a cross-sectional view taken along line C-C of FIG. 4.

Referring to FIGS. 4 and 5, a first lower conductive line WL1 and a second lower conductive line WL2 may be formed on a substrate 100.

The first lower conductive line WL1 and the second lower conductive line WL2 may extend (e.g., lengthwise) in the first direction X. The first lower conductive line WL1 and the second lower conductive line WL2 may be spaced apart from each other in the second direction Y.

Figure 6:
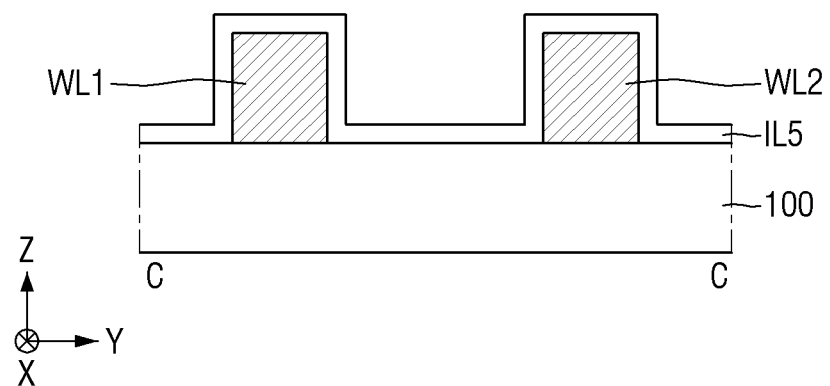

Referring to FIG. 6, a fifth insulating layer IL5 may be formed along profiles of (e.g., may be formed conformally on) the substrate 100, the first lower conductive line WL1, and the second lower conductive line WL2.

The fifth insulating layer IL5 may be formed using, e.g., chemical vapor deposition (CVD), physics vapor deposition (PVD), or atomic layer deposition (ALD). In an implementation, the fifth insulating layer IL5 may be formed using ALD.

Figure 7:
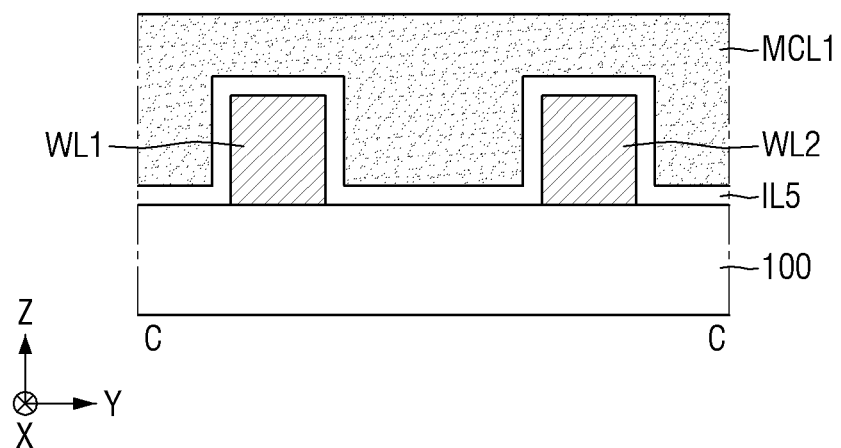

Referring to FIG. 7, a first mold carbon layer MCL1 may be formed on the fifth insulating layer IL5.

The first mold carbon layer MCL1 may be formed by depositing two or more kinds of monomers containing carbon (C) in a CVD chamber at 50 to 100° C. The first mold carbon layer MCL1 may be a polymer including carbon (C), hydrogen (H), oxygen (O), and nitrogen (N). The first mold carbon layer MCL1 may be decomposed back into monomers when applied with heat, e.g., heating at a temperature of 170° C. or higher.

Figure 8:
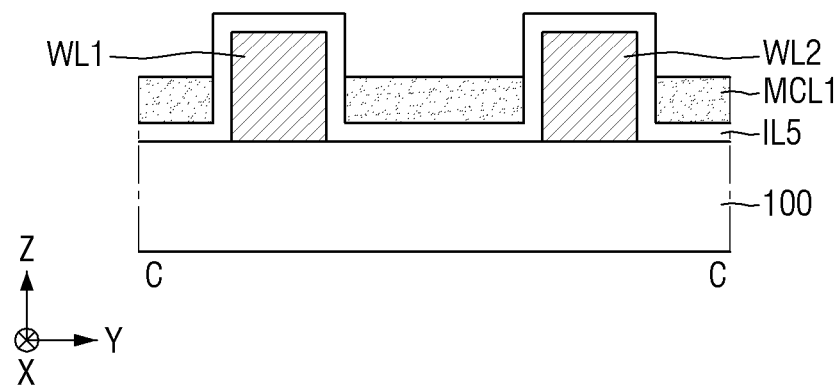

Referring to FIG. 8, a part of the first mold carbon layer MCL1 may be removed.

The first mold carbon layer MCL1 may be removed by performing a heat treatment process. The heat treatment process may include applying heat, e.g., heating at a temperature of 170 to 300° C. The heat treatment process may help reduce damage to the fifth insulating layer IL5 in the process of removing the first mold carbon layer MCL1.

Figure 9:
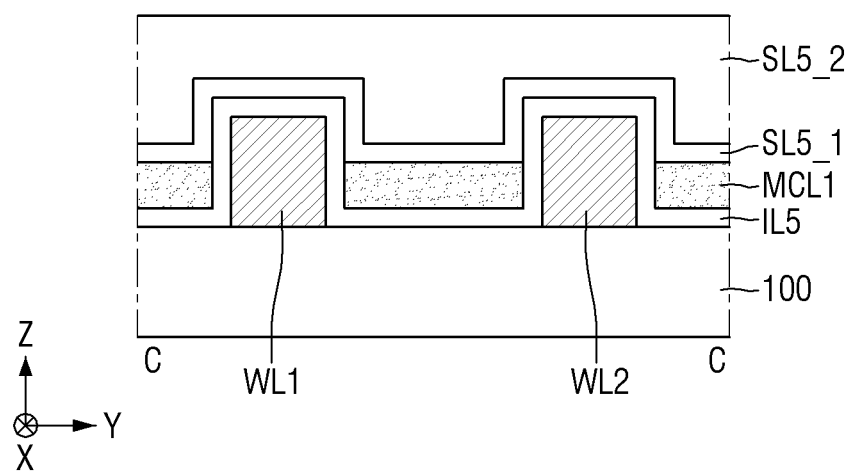

Referring to FIG. 9, a $(5\_1)^{th}$ air gap support layer SL5_1 and a $(5\_2)^{th}$ air gap support layer SL5_2 may be formed on the fifth insulating layer IL5 and the first mold carbon layer MCL1.

In an implementation, the $(5\_1)^{th}$ air gap support layer SL5_1 may be formed along profiles of the fifth insulating layer IL5 and the first mold carbon layer MCL1. The $(5\_2)^{th}$ air gap support layer SL5_2 may be formed on the $(5\_1)^{th}$ air gap support layer SL5_1.

The $(5\_1)^{th}$ air gap support layer SL5_1 and the $(5\_2)^{th}$ air gap support layer SL5_2 may be made of the same material or may be made of different materials.

Figure 10:
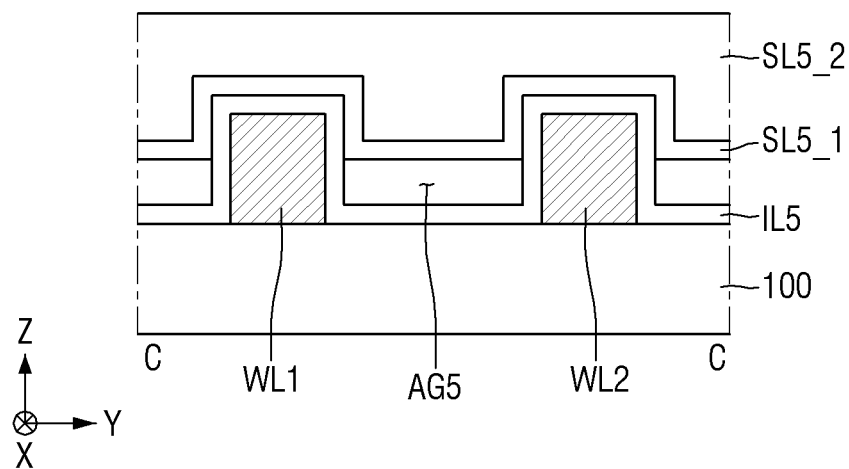

Referring to FIG. 10, a fifth air gap AG5 may be formed by removing the first mold carbon layer MCL1.

The first mold carbon layer MCL1 may be removed by performing a heat treatment process. The heat treatment process may include applying heat, e.g., heating at a temperature of 170 to 300° C. The use of the heat treatment process may help reduce damage to the fifth insulating layer IL5 in the process of removing the first mold carbon layer MCL1.

Figure 11:
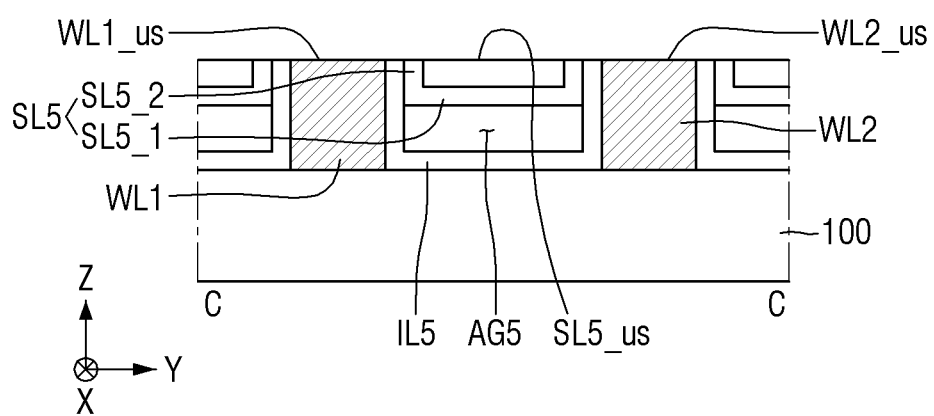

Referring to FIG. 11, a fifth air gap support layer SL5 may be formed by partially removing the $(5\_1)^{th}$ air gap support layer SL5_1, the $(5\_2)^{th}$ air gap support layer SL5_2, and the fifth insulating layer IL5.

The $(5\_1)^{th}$ air gap support layer SL5_1, the $(5\_2)^{th}$ air gap support layer SL5_2, and the fifth insulating layer IL5 may be removed using a chemical mechanical polishing (CMP) process.

Therefore, an upper surface WL1_us of the first lower conductive line WL1, an upper surface SL5_us of the fifth air gap support layer SL5, and an upper surface WL2_us of the second lower conductive line WL2 may lie in substantially the same plane.

Referring to FIGS. 9 through 11, the fifth air gap AG5 may be formed after the $(5\_2)^{th}$ air gap support layer SL5_2 is formed. In an implementation, it may be formed after only the $(5\_1)^{th}$ air gap support layer SL5_1 is formed or may be formed after the fifth air gap support layer SL5 is formed.

FIGS. 12 through 20 are views of stages in a method of fabricating a semiconductor memory device according to the embodiments of the present disclosure.

Figure 12:
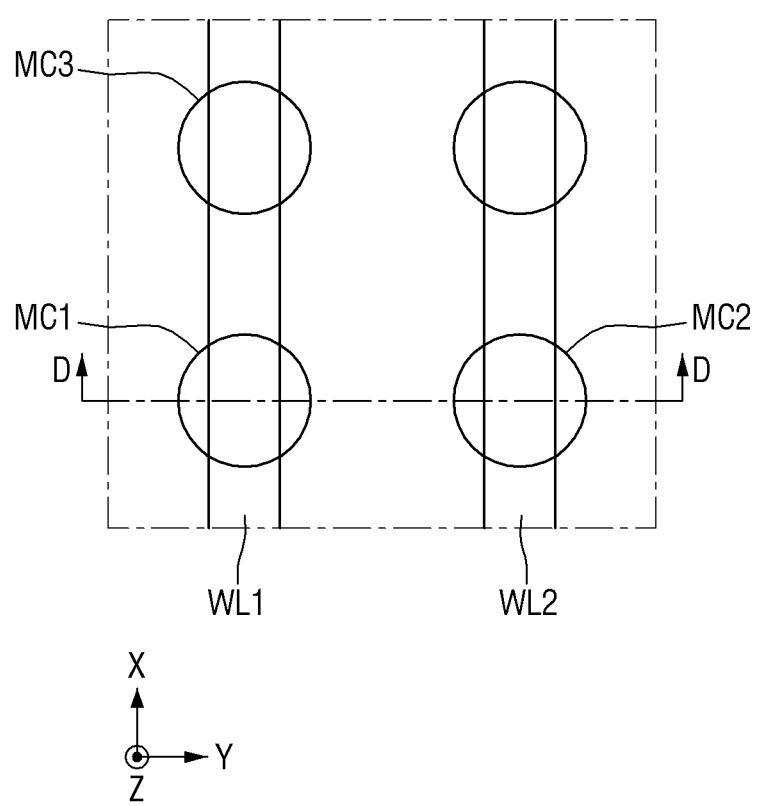
FIGS. 12 through 20 are views of stages in a method of fabricating a semiconductor memory device according to the embodiments of the present disclosure.
Figure 13:
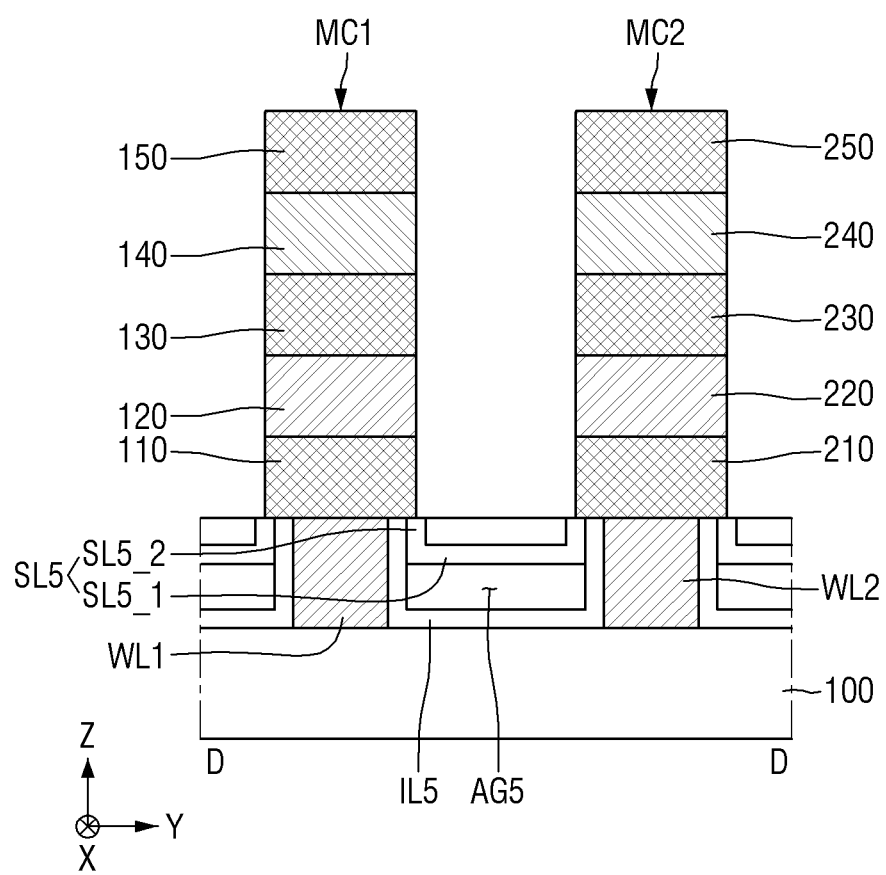

FIG. 12 is a layout view of a stage in a method of fabricating a semiconductor memory device according to the embodiments. FIG. 13 is a cross-sectional view taken along line D-D of FIG. 12.

Referring to FIGS. 12 and 13, a first memory cell MC1 may be formed on the first lower conductive line WL1.

A second memory cell MC2 may be formed on the second lower conductive line WL2. A third memory cell MC3 (spaced apart from the first memory cell MC1 in the first direction X) may be formed on the first lower conductive line WL1. The first memory cell MC1 and the second memory cell MC2 may be spaced apart from each other in the second direction Y.

Figure 14:
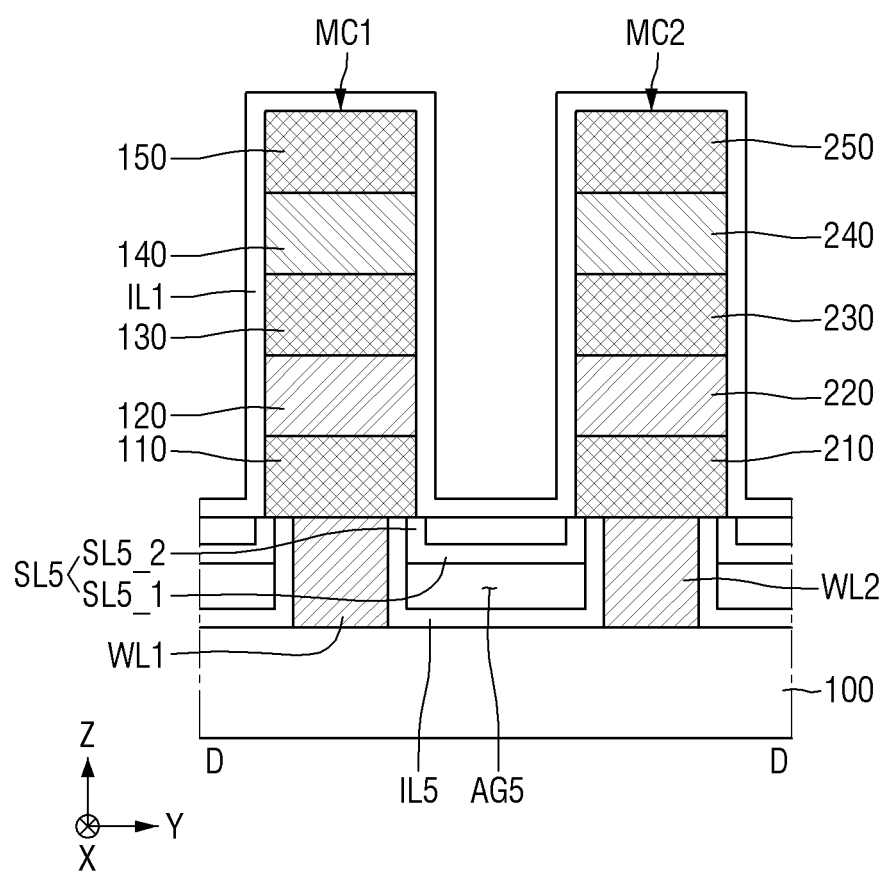

Referring to FIG. 14, a first insulating layer IL1 may be formed along profiles of the first and second memory cells MC1 and MC2 and the fifth air gap support layer SL5.

The first insulating layer IL1 may be formed using CVD, PVD, or ALD. In an implementation, the first insulating layer IL1 may be formed using ALD.

Figure 15:
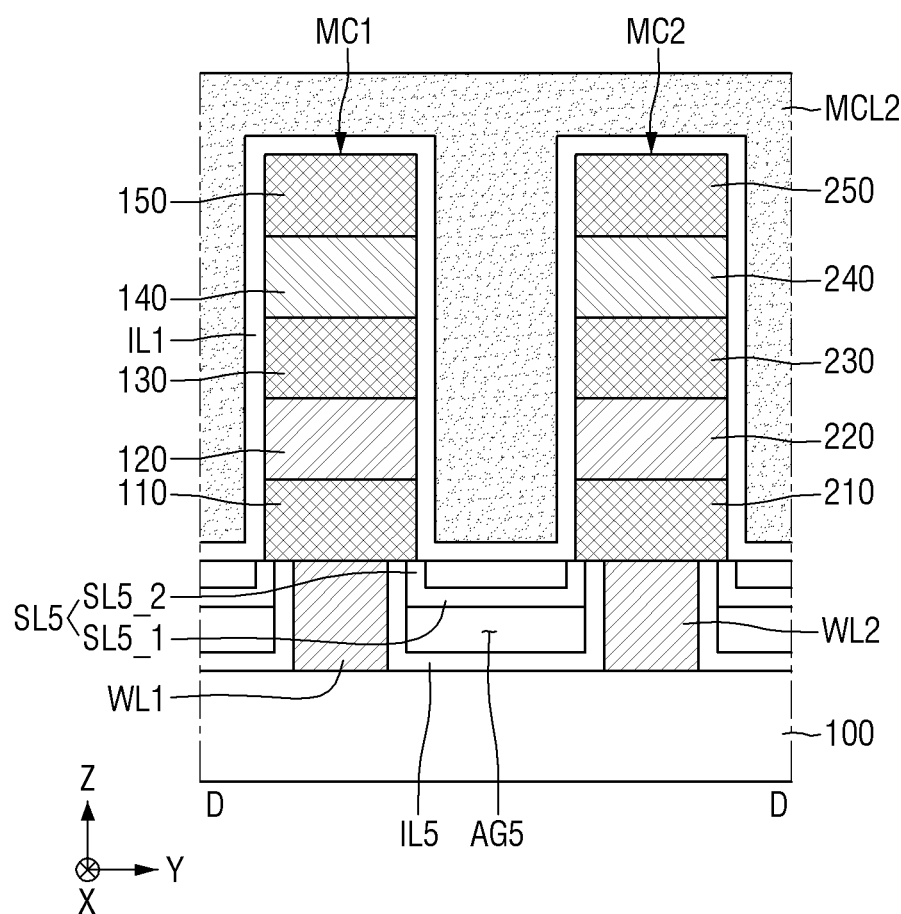

Referring to FIG. 15, a second mold carbon layer MCL2 may be formed on the first insulating layer The second mold carbon layer MCL2 may be the same material as the first mold carbon layer (e.g., MCL1 of FIG. 7).

Figure 16:
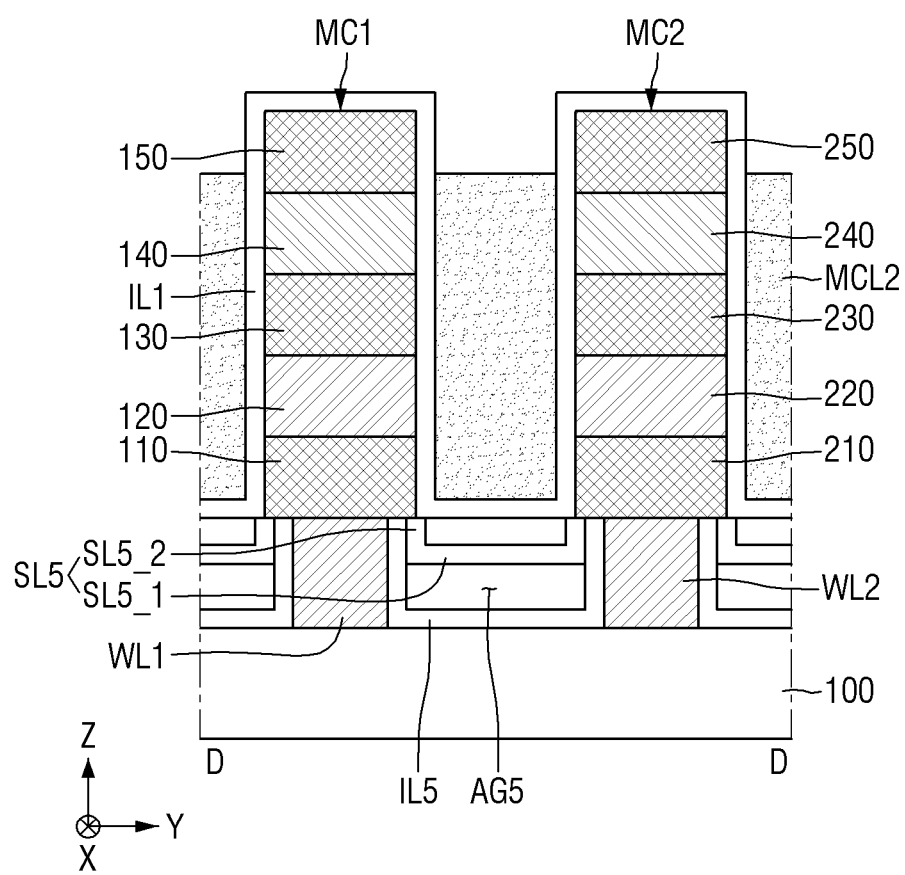

Referring to FIG. 16, a part of the second mold carbon layer MCL2 may be removed.

The second mold carbon layer MCL2 may be removed using a heat treatment process. The heat treatment process may include applying heat, e.g., heating at a temperature of 170 to 300° C. The use of the heat treatment process may help reduce damage to the first insulating layer IL1 in the process of removing the second mold carbon layer MCL2.

Figure 17:
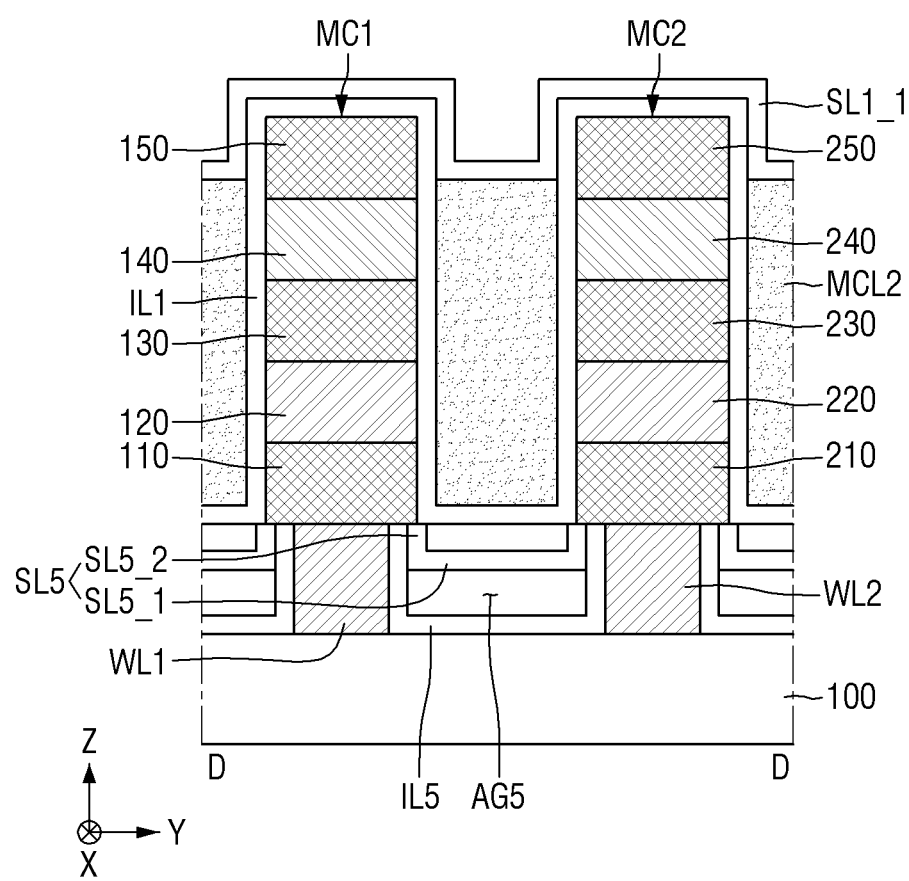

Referring to FIG. 17, a $(1\_1)^{th}$ air gap support layer SL1_1 may be formed along profiles of the second mold carbon layer MCL2 and the first and second memory cells MC1 and MC2.

Figure 18:
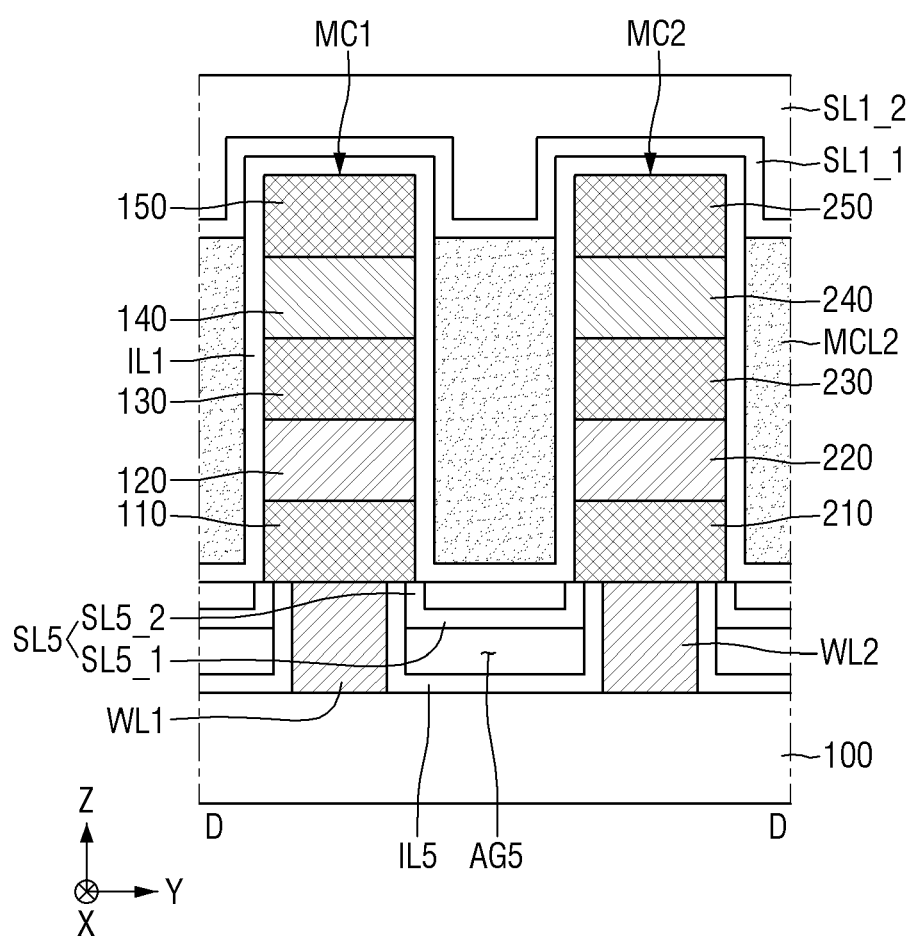

Referring to FIG. 18, a $(1\_2)^{th}$ air gap support layer SL1_2 may be formed on the $(1\_1)^{th}$ air gap support layer SL1_1.

The $(1\_1)^{th}$ air gap support layer SL1_1 and the $(1\_2)^{th}$ air gap support layer SL1_2 may be made of the same material or may be made of different materials.

Figure 19:
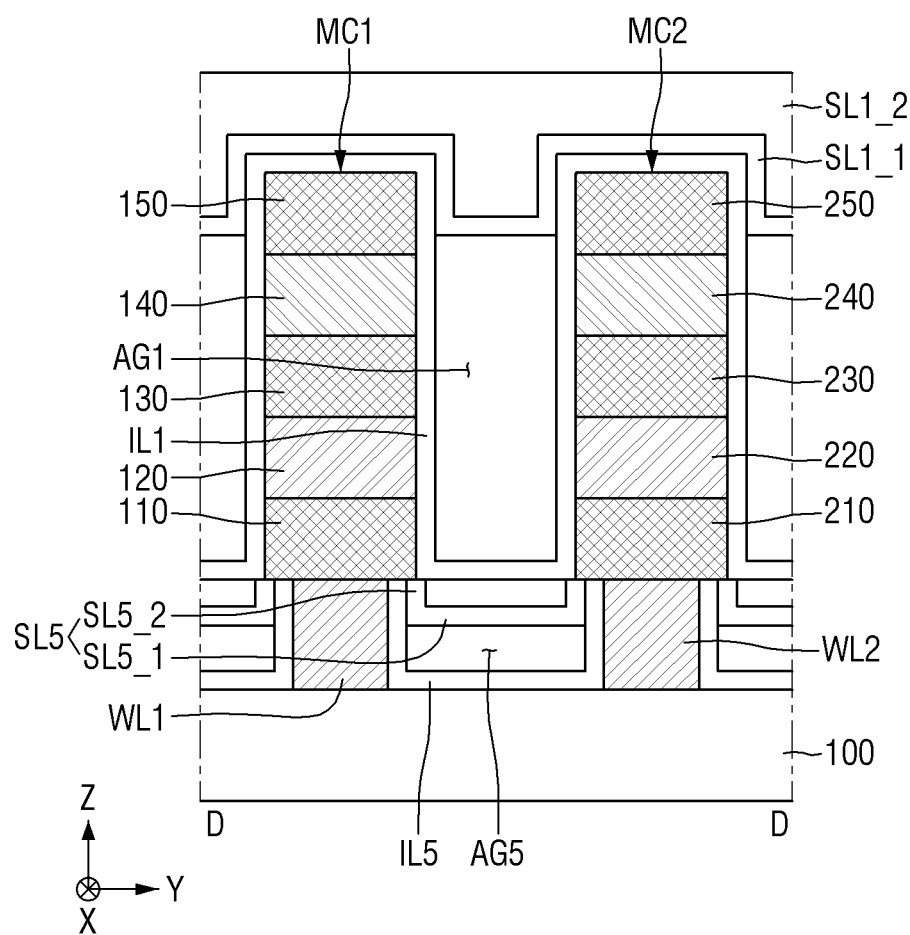

Referring to FIG. 19, a first air gap AG1 may be formed by removing the second mold carbon layer MCL2.

The second mold carbon layer MCL2 may be removed using a heat treatment process. The heat treatment process may include applying heat, e.g., heating at a temperature of 170 to 300° C. The use of the heat treatment process may reduce damage to the first insulating layer IL1 in the process of removing the second mold carbon layer MCL2.

Figure 20:
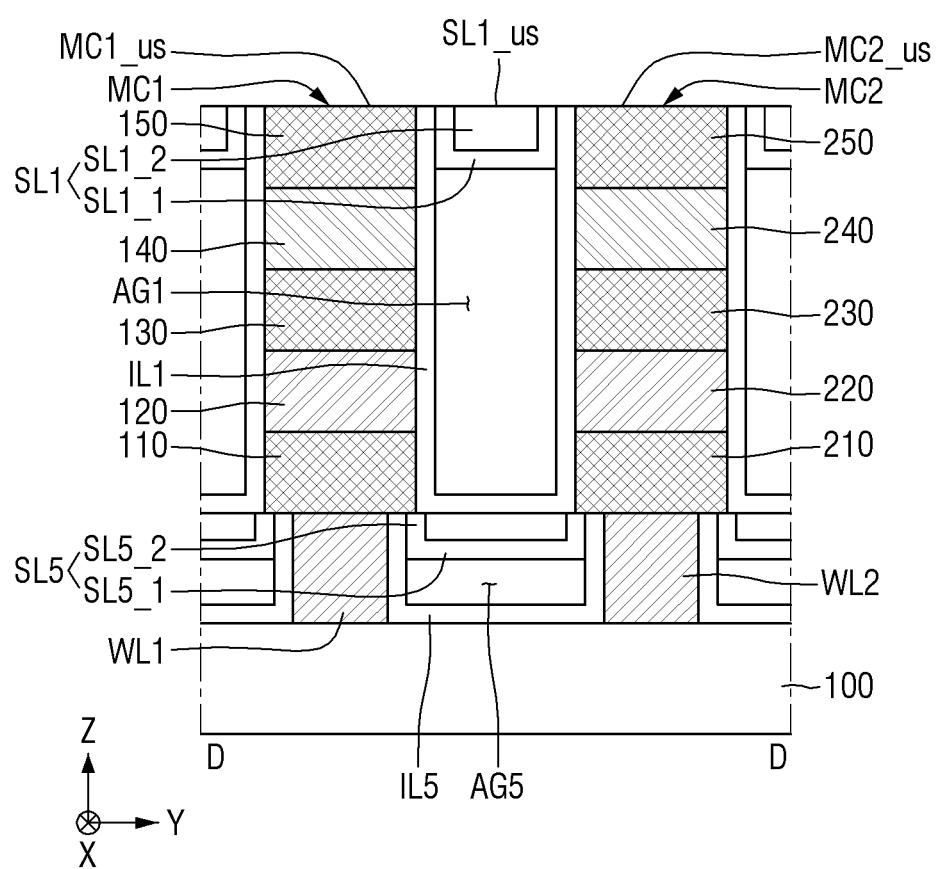

Referring to FIG. 20, a first air gap support layer SL1 may be formed by partially removing the first insulating layer IL1, the $(1\_1)^{th}$ air gap support layer SL1_1, and the $(1\_2)^{th}$ air gap support layer SL1_2.

The $(1\_1)^{th}$ air gap support layer SL1_1, the $(1\_2)^{th}$ air gap support layer SL1_2, and the first insulating layer IL1 may be removed using a CMP process.

In an implementation, an upper surface SL1_us of the first air gap support layer SL1 may lie in substantially the same plane as an upper surface MC1_us of the first memory cell MC1 and an upper surface MC2_us of the second memory cell MC2.

Referring to FIGS. 18 through 20, the first air gap AG1 may be formed after the $(1\_2)^{th}$ air gap support layer SL1_2 is formed. In an implementation, it may be formed after the $(1\_1)^{th}$ air gap support layer SL1_1 is formed or may be formed after the first air gap support layer SL1 is formed.

FIGS. 21 through 30 are views of stages in a method of fabricating a semiconductor memory device according to the embodiments of the present disclosure.

Figure 21:
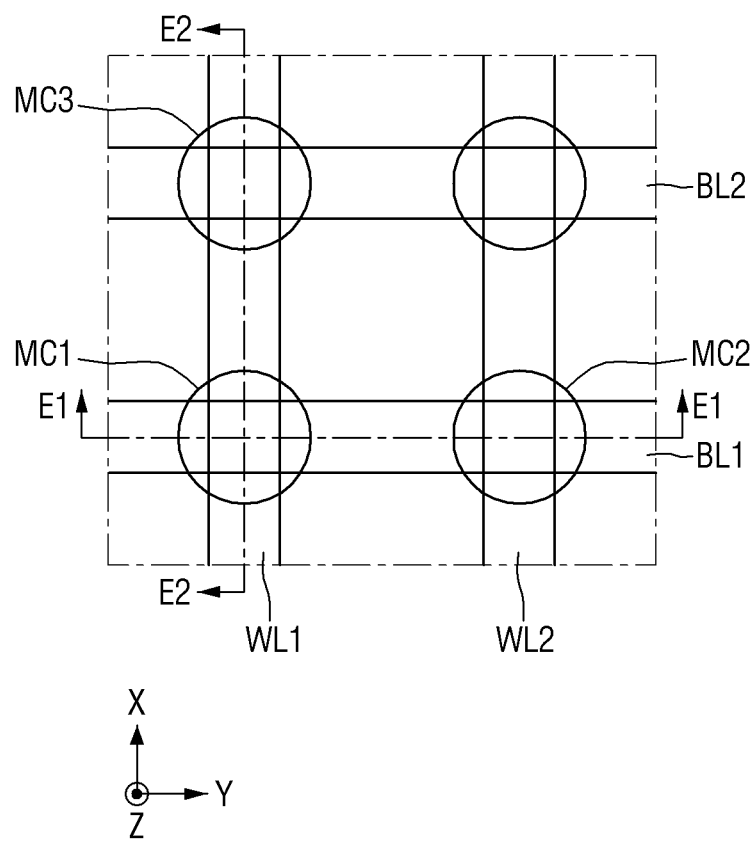
FIGS. 21 through 30 are views of stages in a method of fabricating a semiconductor memory device according to the embodiments of the present disclosure.
Figure 22:
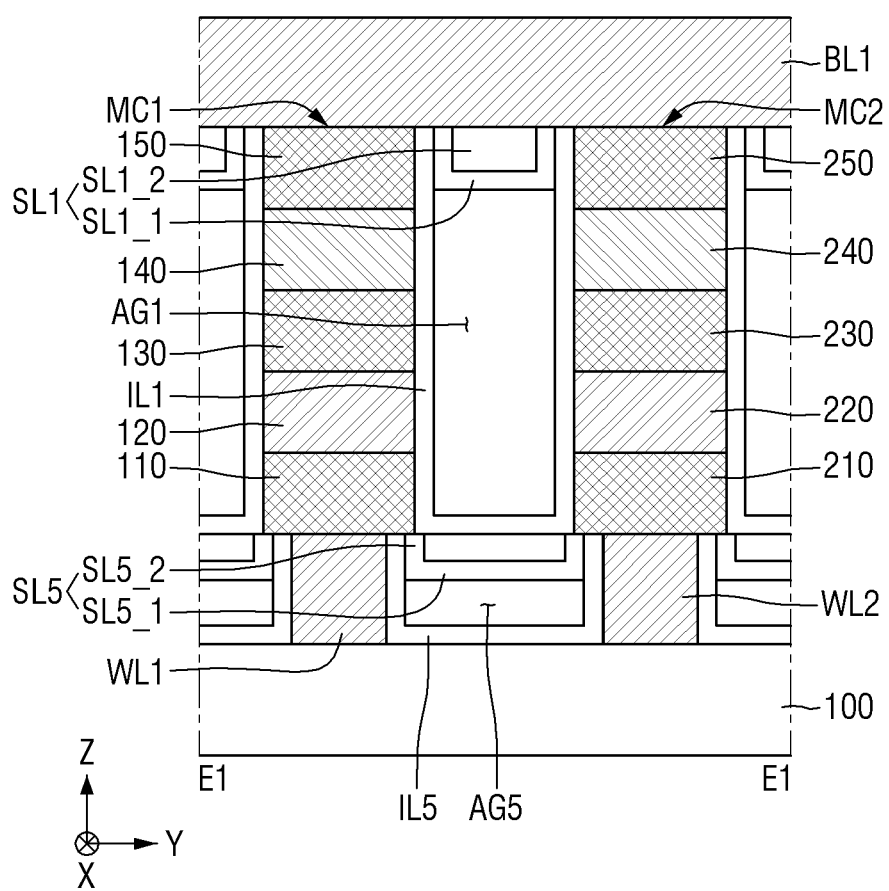
Figure 23:
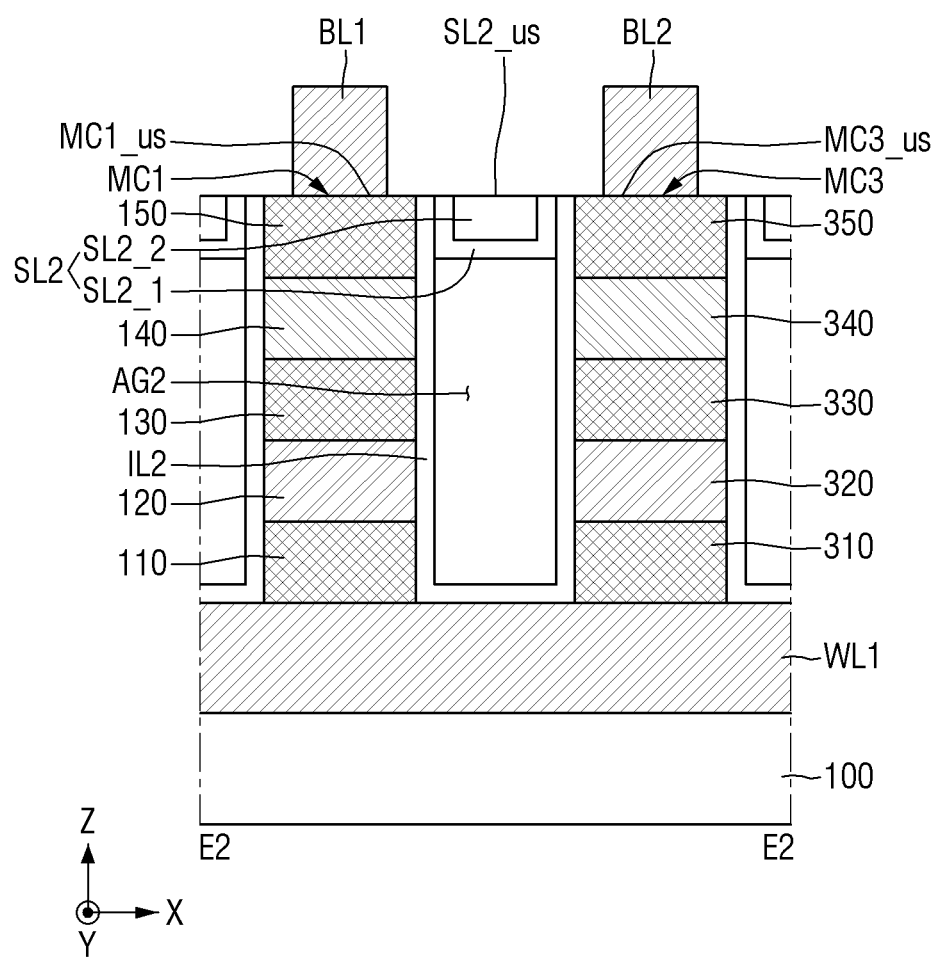

FIG. 21 is a layout view of a stage in a method of fabricating a semiconductor memory device according to the embodiments. FIG. 22 is a cross-sectional view taken along line E1-E1 of FIG. 21. FIG. 23 is a cross-sectional view taken along line E2-E2 of FIG. 21. FIGS. 24 through 30 will be described based on a cross section taken along line E2-E2 of FIG. 21.

Referring to FIGS. 21 through 23, a first middle conductive line BL1 and a second middle conductive line BL2 may be formed.

The first and second middle conductive lines BL1 and BL2 may extend in the second direction Y. The first and second middle conductive lines BL1 and BL2 may be spaced apart from each other in the first direction X.

Figure 24:
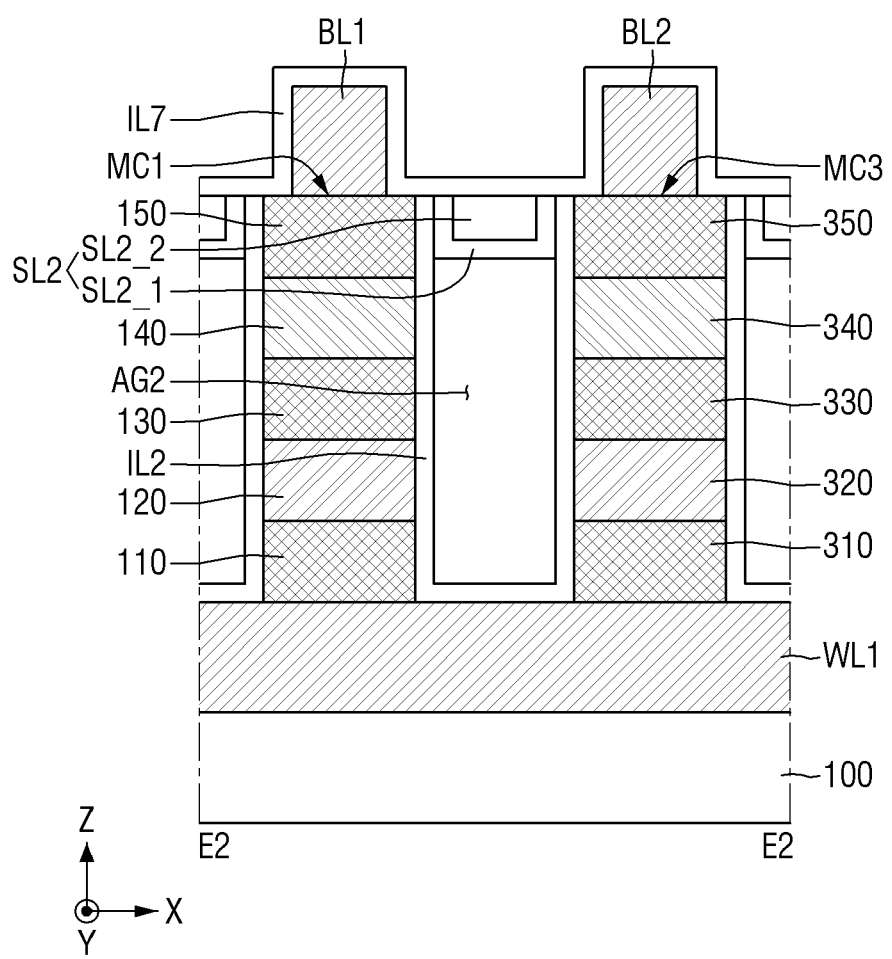

Referring to FIG. 24, a seventh insulating layer IL7 may be formed along profiles of the first and second middle conductive lines BL1 and BL2 and a second air gap support layer SL2.

The seventh insulating layer IL7 may be formed using CVD, PVD, or ALD. In an implementation, the seventh insulating layer IL7 may be formed using ALD.

Figure 25:
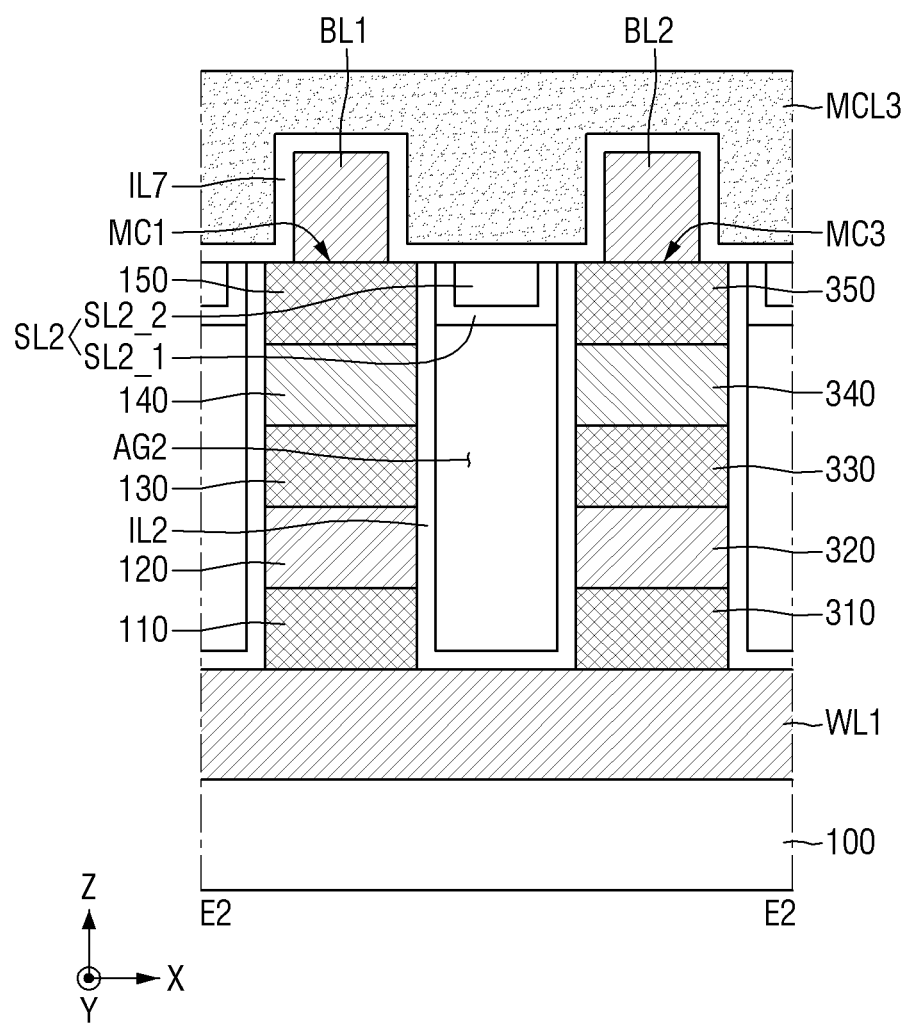

Referring to FIG. 25, a third mold carbon layer MCL3 may be formed on the seventh insulating layer IL7.

The third mold carbon layer MCL3 may be the same material as the first mold carbon layer (e.g., MCL1 of FIG. 7).

Figure 26:
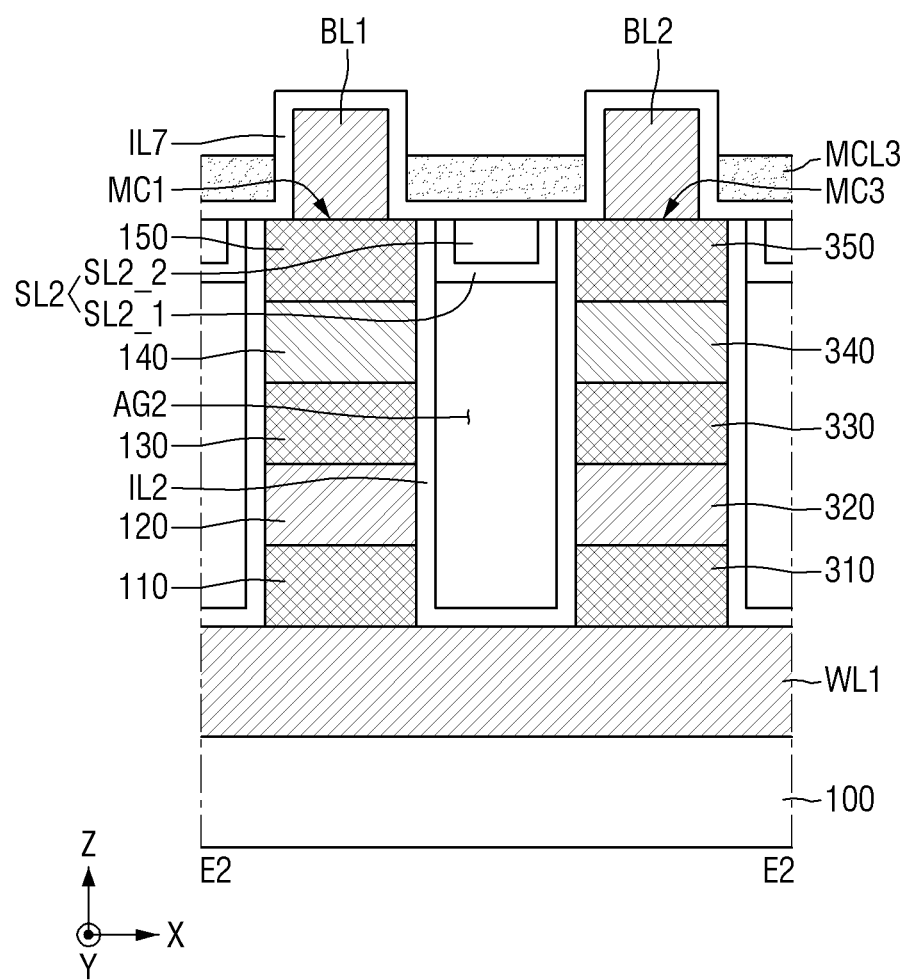

Referring to FIG. 26, a part of the third mold carbon layer MCL3 may be removed.

The third mold carbon layer MCL3 may be removed using a heat treatment process. The heat treatment process may include applying heat, e.g., heating at a temperature of 170 to 300° C. The use of the heat treatment process may reduce damage to the seventh insulating layer IL7 in the process of removing the third mold carbon layer MCL3.

Figure 27:
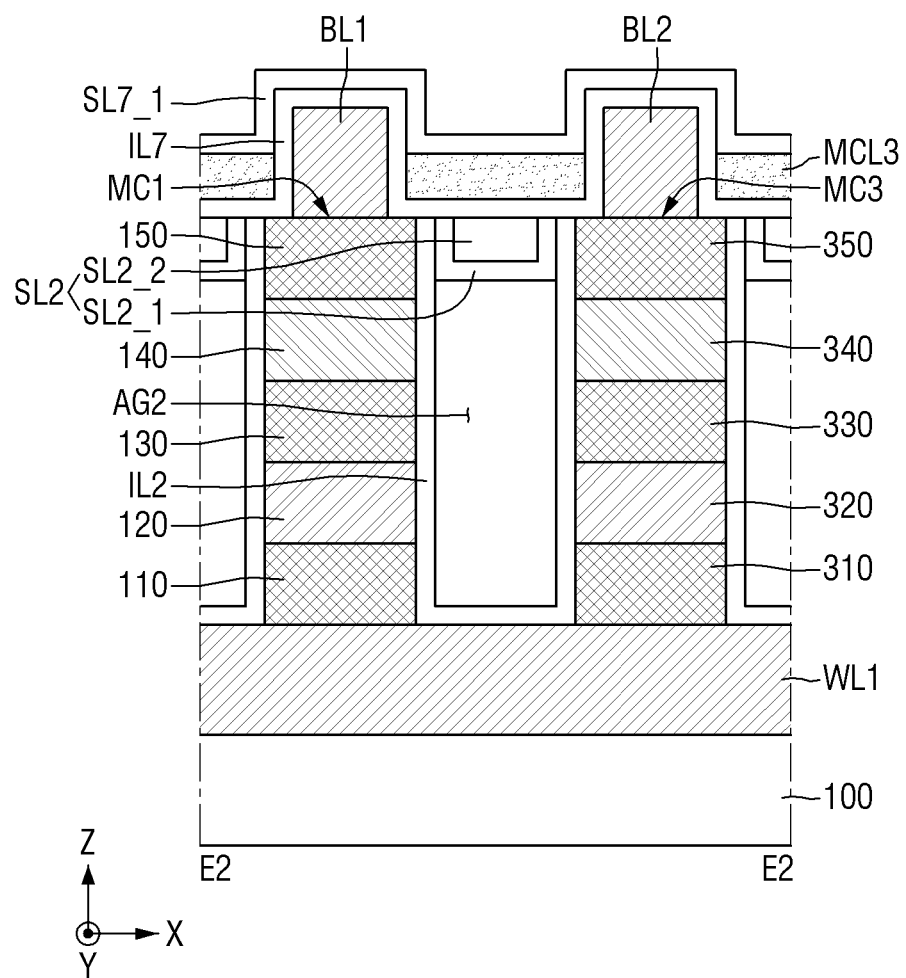

Referring to FIG. 27, a $(7\_1)^{th}$ air gap support layer SL7_1 may be formed along profiles of the third mold carbon layer MCL3 and the first and second middle conductive lines BL1 and BL2.

Figure 28:
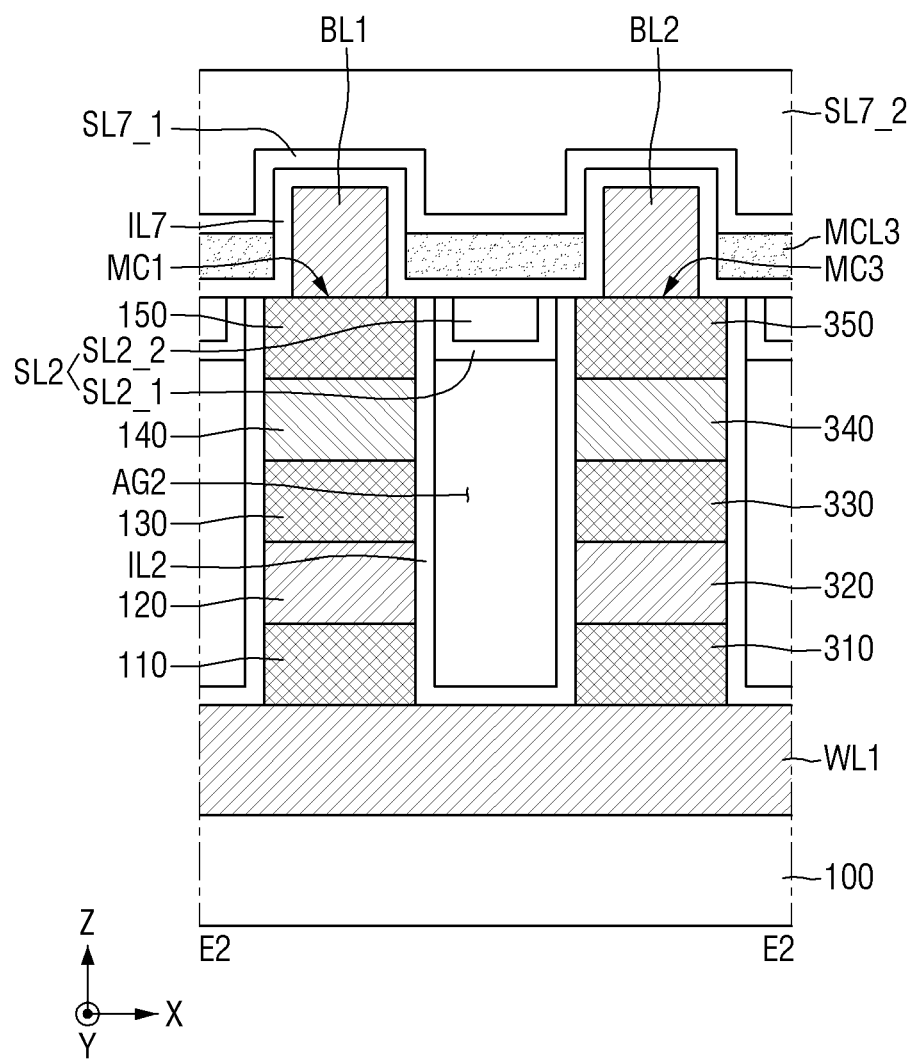

Referring to FIG. 28, a $(7\_2)^{th}$ air gap support layer SL7_2 may be formed on the $(7\_1)^{th}$ air gap support layer SL7_1.

The $(7\_1)^{th}$ air gap support layer SL7_1 and the $(7\_2)^{th}$ air gap support layer SL7_2 may be made of the same material or may be made of different materials.

Figure 29:
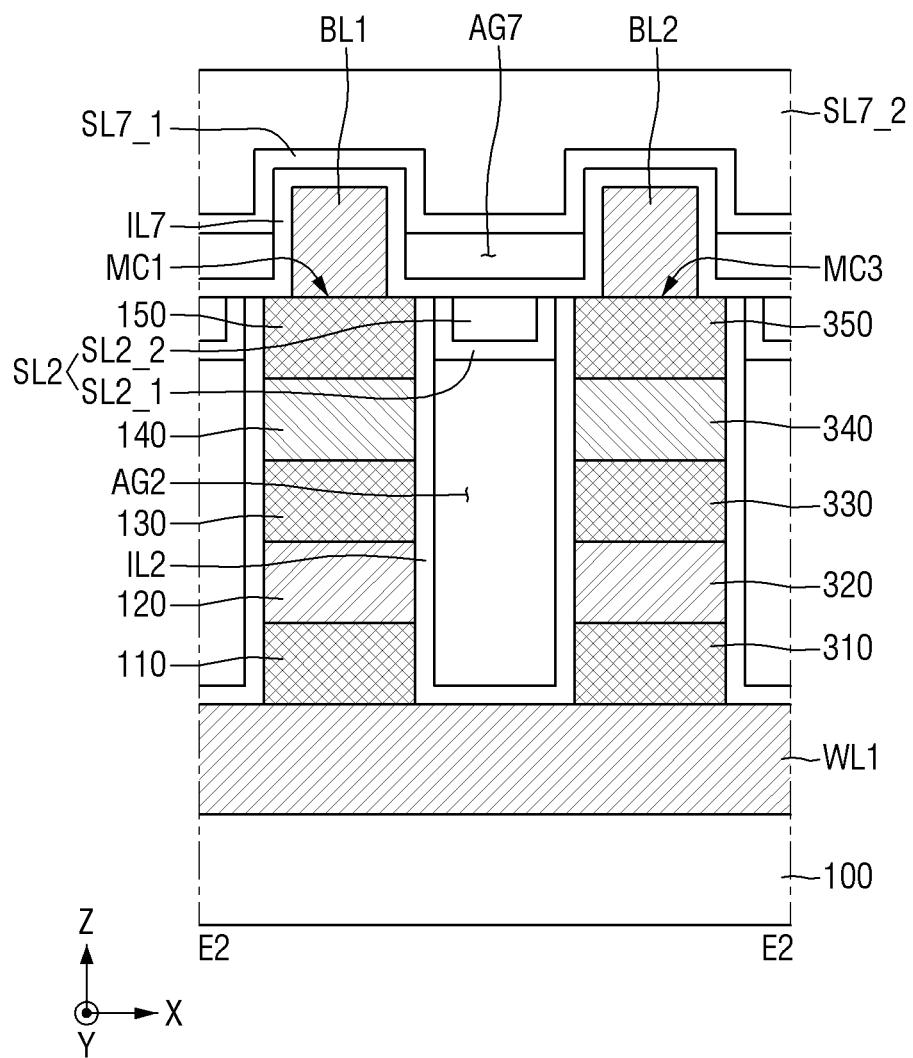

Referring to FIG. 29, a seventh air gap AG7 may be formed by removing the third mold carbon layer MCL3.

The third mold carbon layer MCL3 may be removed using a heat treatment process. The heat treatment process may include applying heat, e.g., heating at a temperature of 170 to 300° C. The use of the heat treatment process may help reduce damage to the seventh insulating layer IL7 in the process of removing the third mold carbon layer MCL3.

Figure 30:
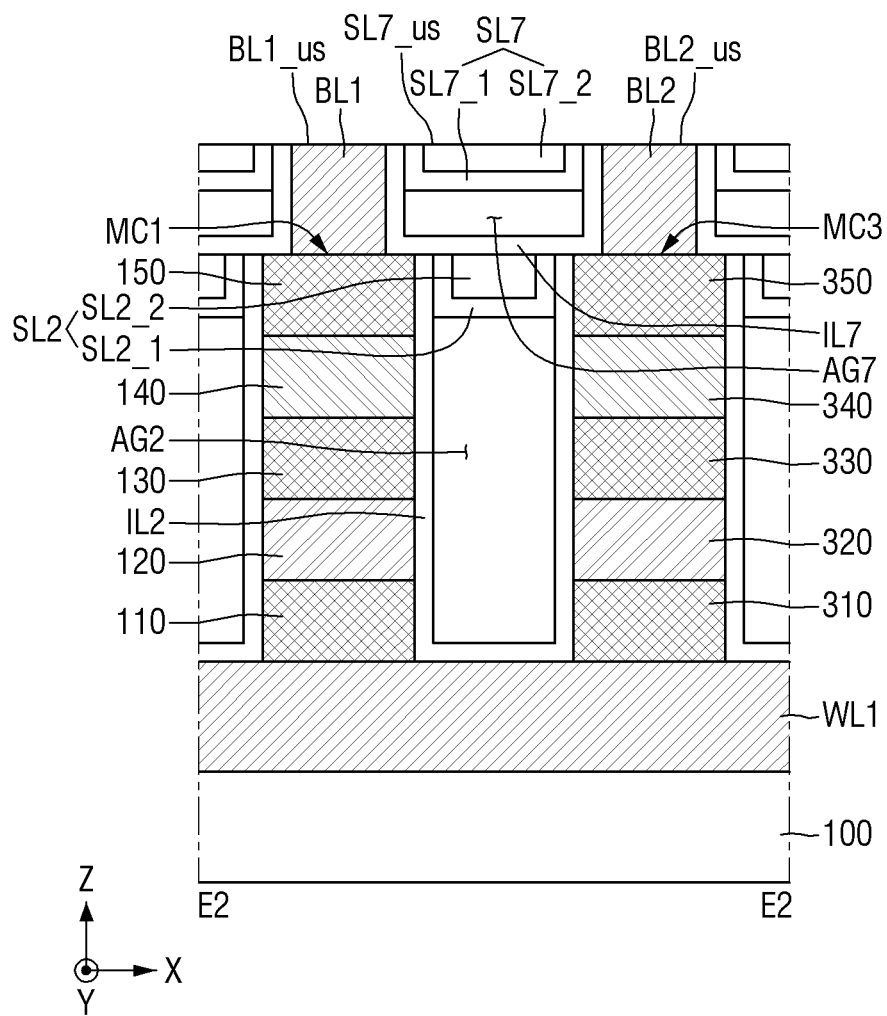

Referring to FIG. 30, a seventh air gap support layer SL7 may be formed by partially removing the seventh insulating layer IL7, the $(7\_1)^{th}$ air gap support layer SL7_1, and the $(7\_2)^{th}$ air gap support layer SL7_2.

The $(7\_1)^{th}$ air gap support layer SL7_1, the $(7\_2)^{th}$ air gap support layer SL7_2, and the seventh insulating layer IL7 may be removed using a CMP process.

In an implementation, an upper surface SL7_us of the seventh air gap support layer SL7 may lie in substantially the same plane as an upper surface BL1_us of the first middle conductive line BL1 and an upper surface BL2_us of the second middle conductive line BL2.

Referring to FIGS. 28 through 30, the seventh air gap AG7 may be formed after the $(7\_2)^{th}$ air gap support layer SL7_2 is formed. In an implementation, it may be formed after the $(7\_1)^{th}$ air gap support layer SL7_1 is formed or may be formed after the seventh air gap support layer SL7 is formed.

FIGS. 31 through 39 are views of stages in a method of fabricating a semiconductor memory device according to the embodiments of the present disclosure.

Figure 31:
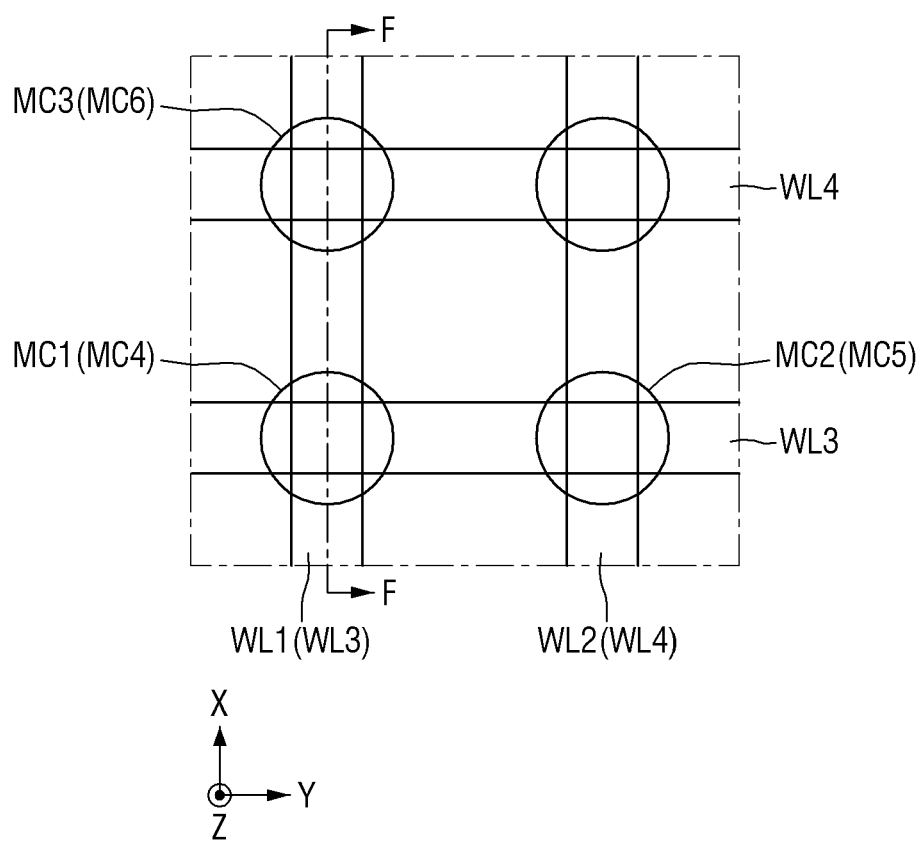
FIGS. 31 through 39 are views of stages in a method of fabricating a semiconductor memory device according to the embodiments of the present disclosure.
Figure 32:
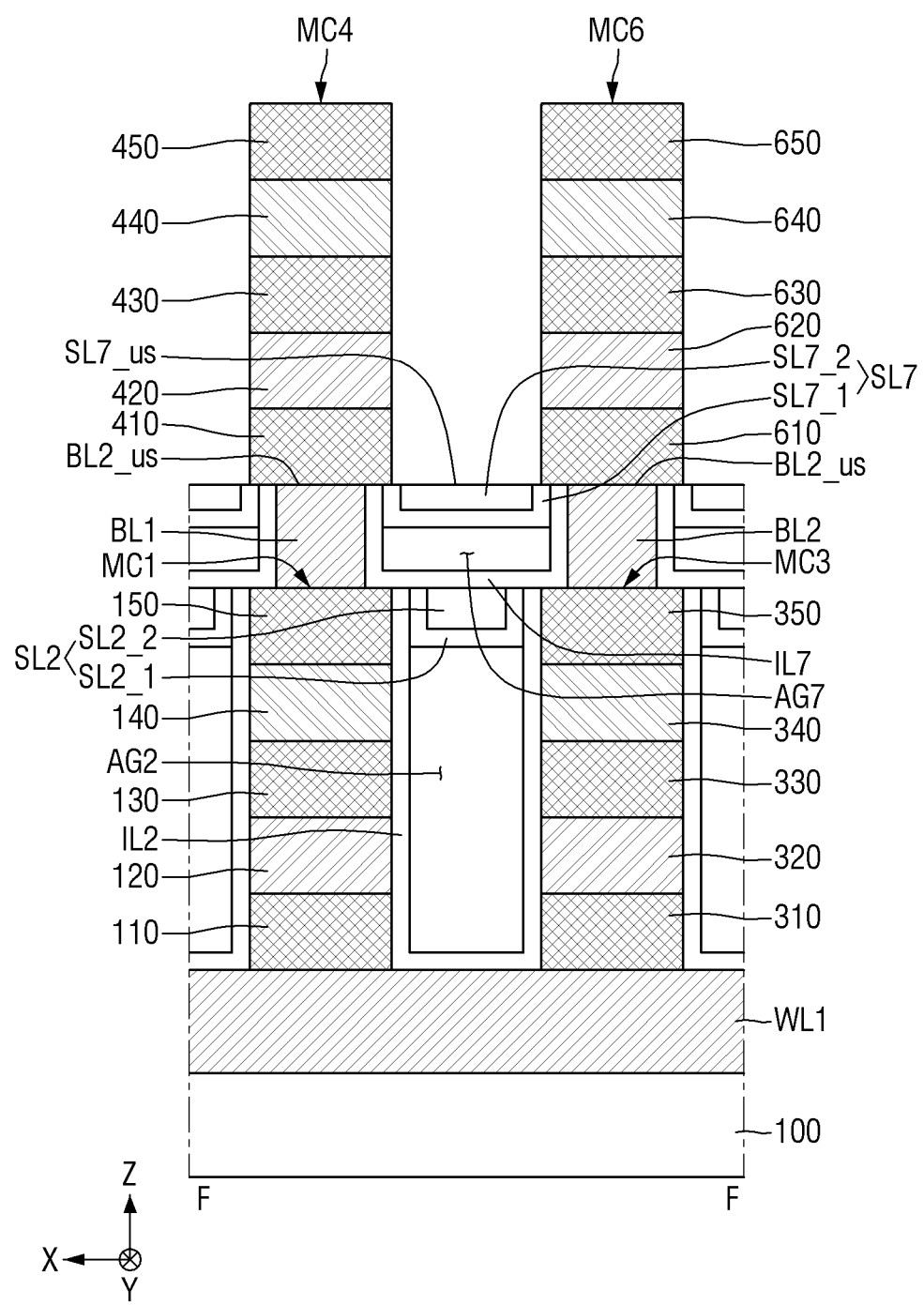

FIG. 31 is a layout view of a stage in a method of fabricating a semiconductor memory device according to the embodiments. FIG. 32 is a cross-sectional view taken along line F-F of FIG. 31.

Referring to FIGS. 31 and 32, a fourth memory cell MC4 may be formed on the first middle conductive line BL1.

A sixth memory cell MC6 (spaced apart from the fourth memory cell MC4 in the first direction X) may be formed on the second middle conductive line BL2. A fifth memory cell MC5 (spaced apart from the fourth memory cell MC4 in the second direction Y) may be formed on the first middle conductive line BL1.

Figure 33:
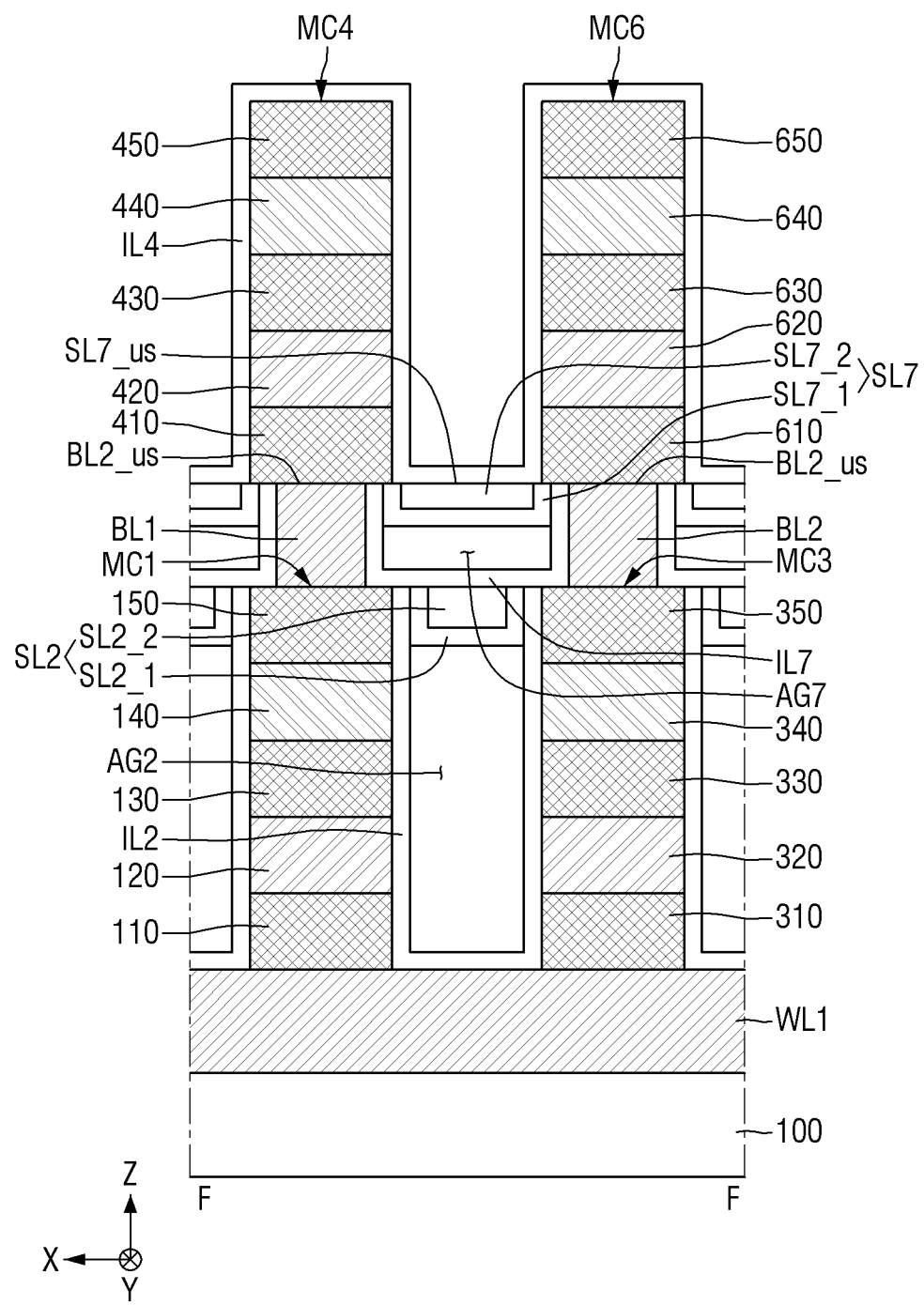

Referring to FIG. 33, a fourth insulating layer IL4 may be formed along profiles of the fourth and sixth memory cells MC4 and MC6 and the seventh air gap support layer SL7.

The fourth insulating layer IL4 may be formed using CVD, PVD, or ALD. In an implementation, the fourth insulating layer IL4 may be formed using ALD.

Figure 34:
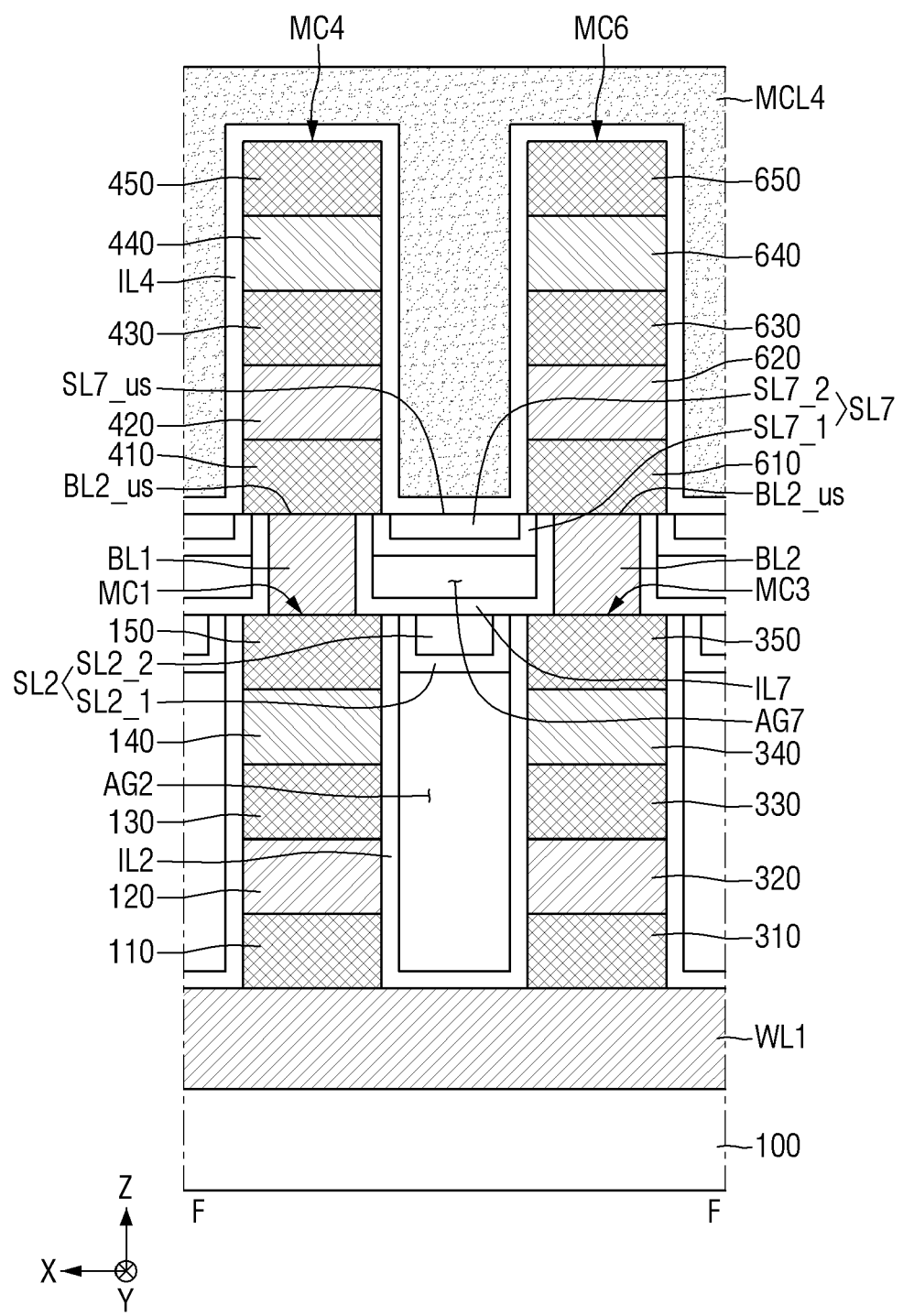

Referring to FIG. 34, a fourth mold carbon layer MCL4 may be formed on the fourth insulating layer IL4.

The fourth mold carbon layer MCL4 may be the same material as the first mold carbon layer (e.g., MCL1 of FIG. 7).

Figure 35:
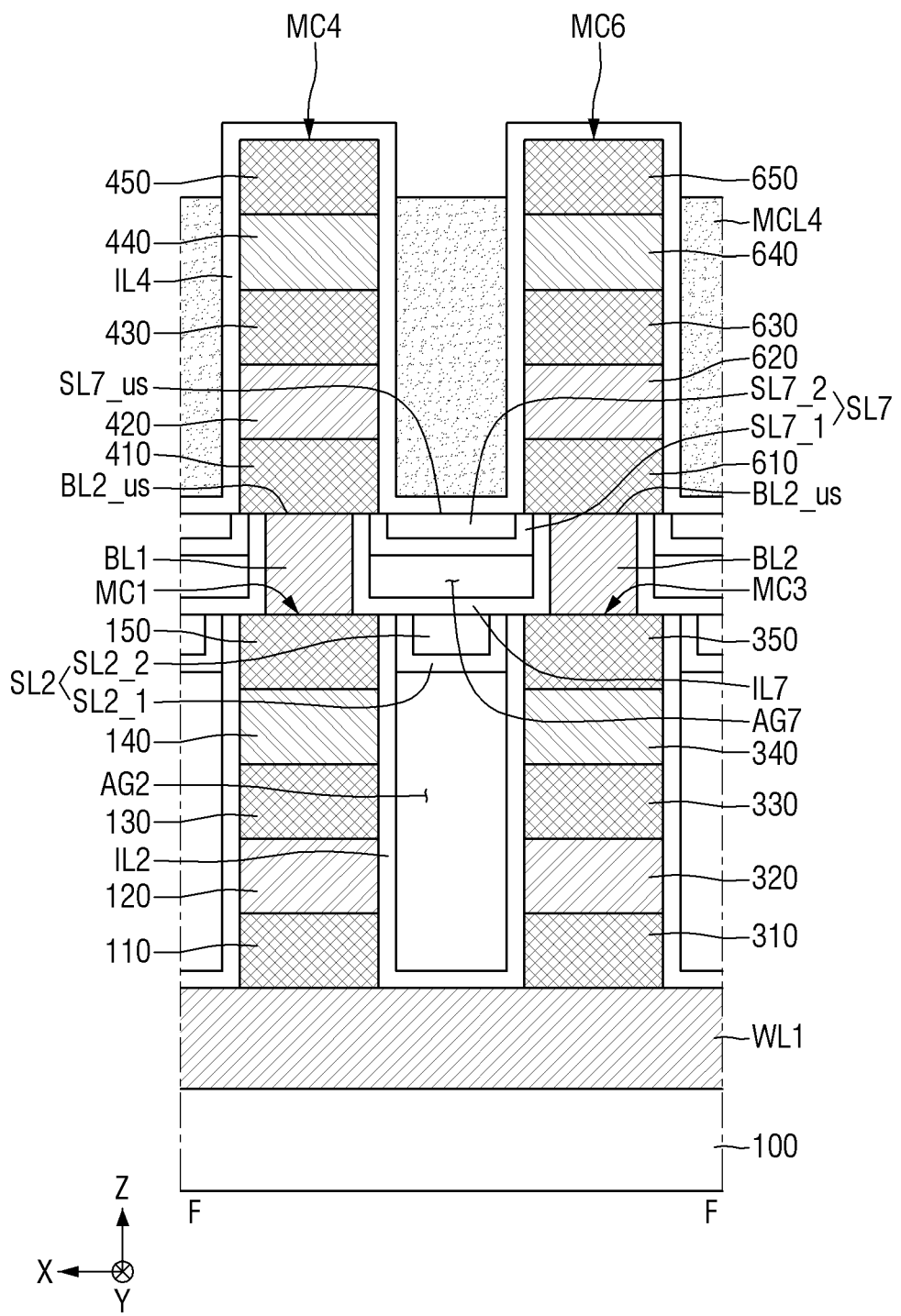

Referring to FIG. 35, a part of the fourth mold carbon layer MCL4 may be removed.

The fourth mold carbon layer MCL4 may be removed using a heat treatment process. The heat treatment process may include applying heat, e.g., heating at a temperature of 170 to 300° C. The use of the heat treatment process may help reduce damage to the fourth insulating layer IL4 in the process of removing the fourth mold carbon layer MCL4.

Figure 36:
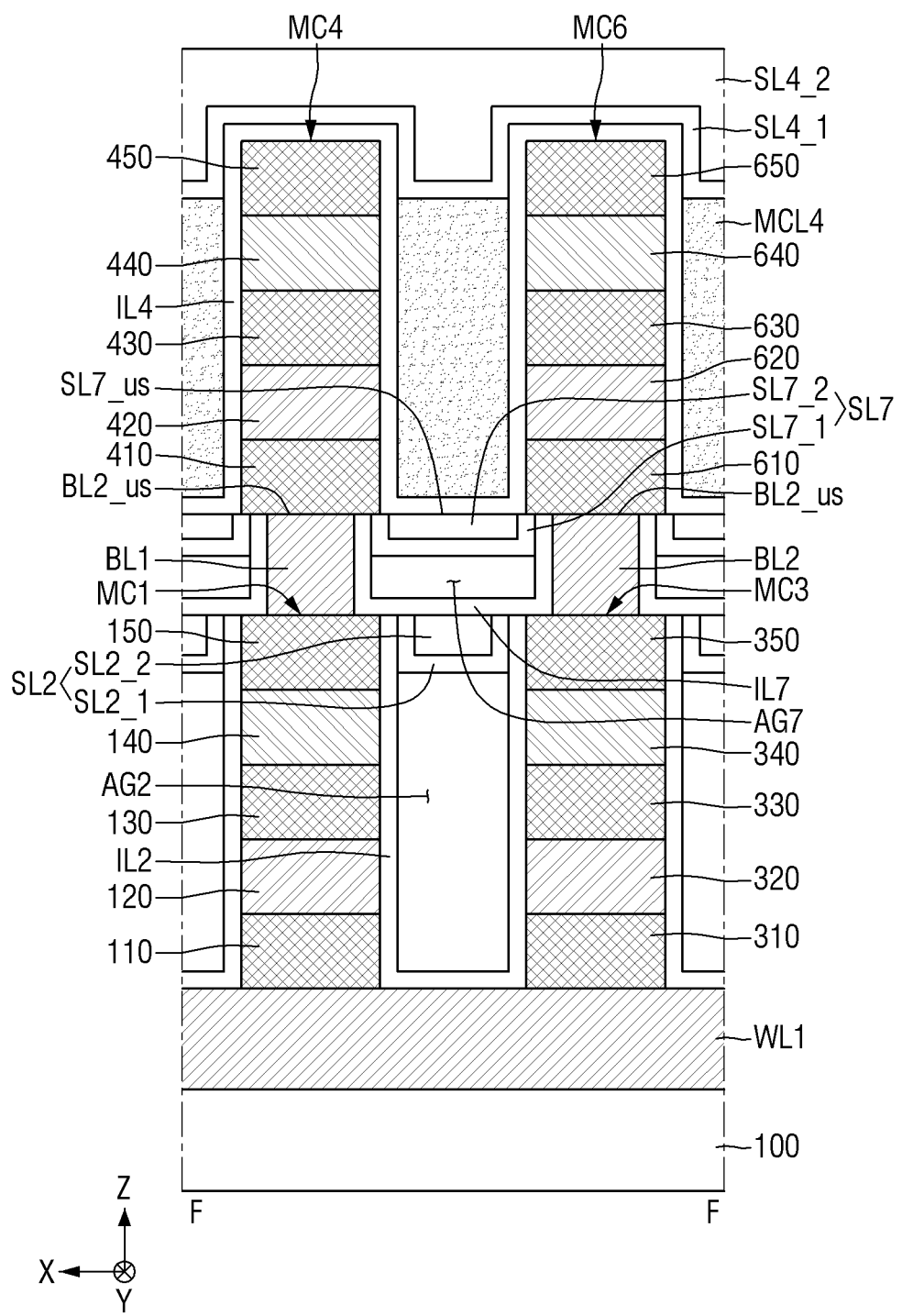

Referring to FIG. 36, a $(4\_1)^{th}$ air gap support layer SL4_1 may be formed along profiles of the fourth mold carbon layer MCL4 and the fourth and sixth memory cells MC4 and MC6. A $(4\_2)^{th}$ air gap support layer SL4_2 may be formed on the $(4\_1)^{th}$ air gap support layer SL4_1.

The $(4\_1)^{th}$ air gap support layer SL4_1 and the $(4\_2)^{th}$ air gap support layer SL4_2 may be made of the same material or may be made of different materials.

Figure 37:
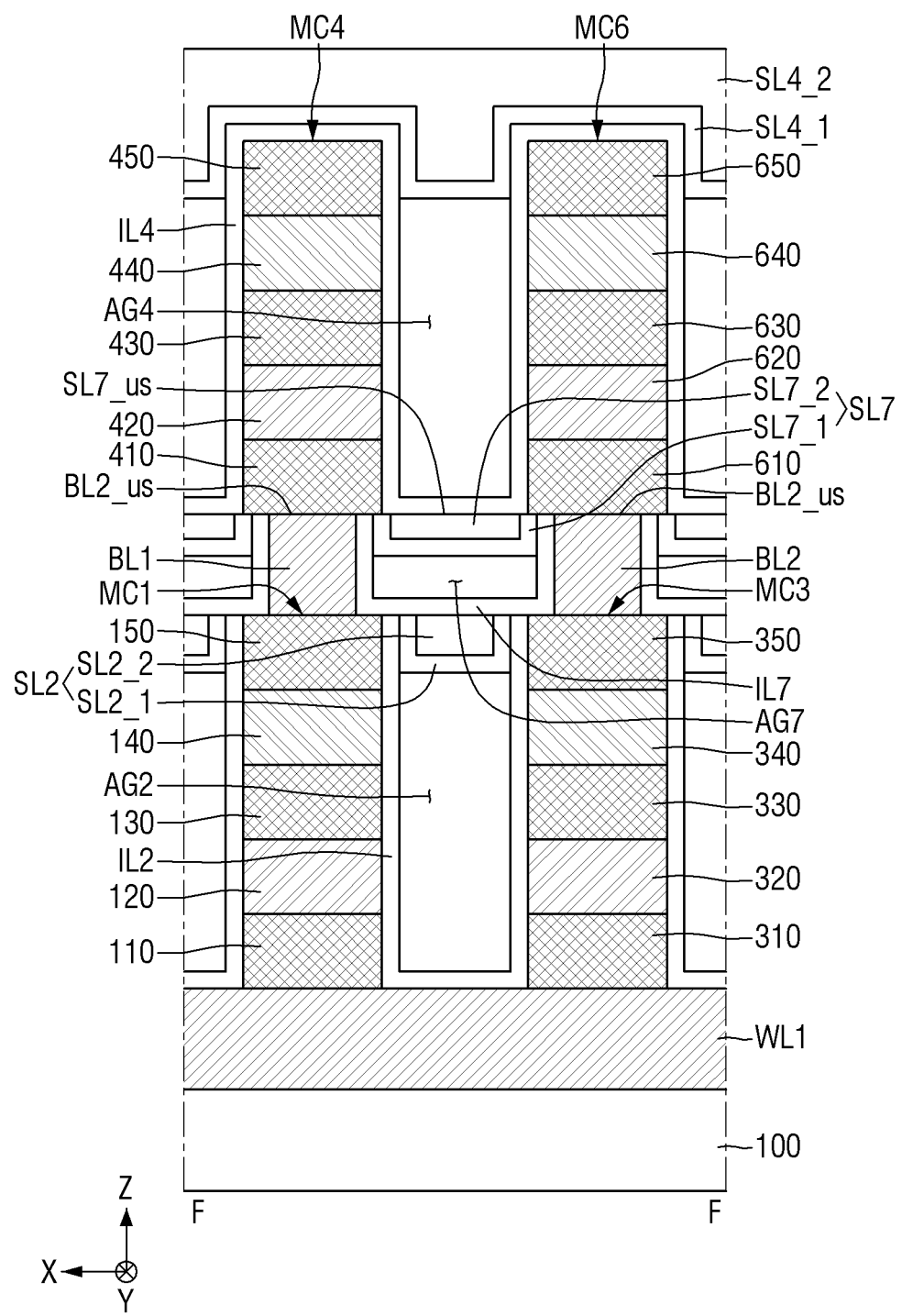

Referring to FIG. 37, a fourth air gap AG4 may be formed by removing the fourth mold carbon layer MCL4.

The fourth mold carbon layer MCL4 may be removed using a heat treatment process. The heat treatment process may include applying heat, e.g., heating at a temperature of 170 to 300° C. The use of the heat treatment process may help reduce damage to the fourth insulating layer IL4 in the process of removing the fourth mold carbon layer MCL4.

Figure 38:
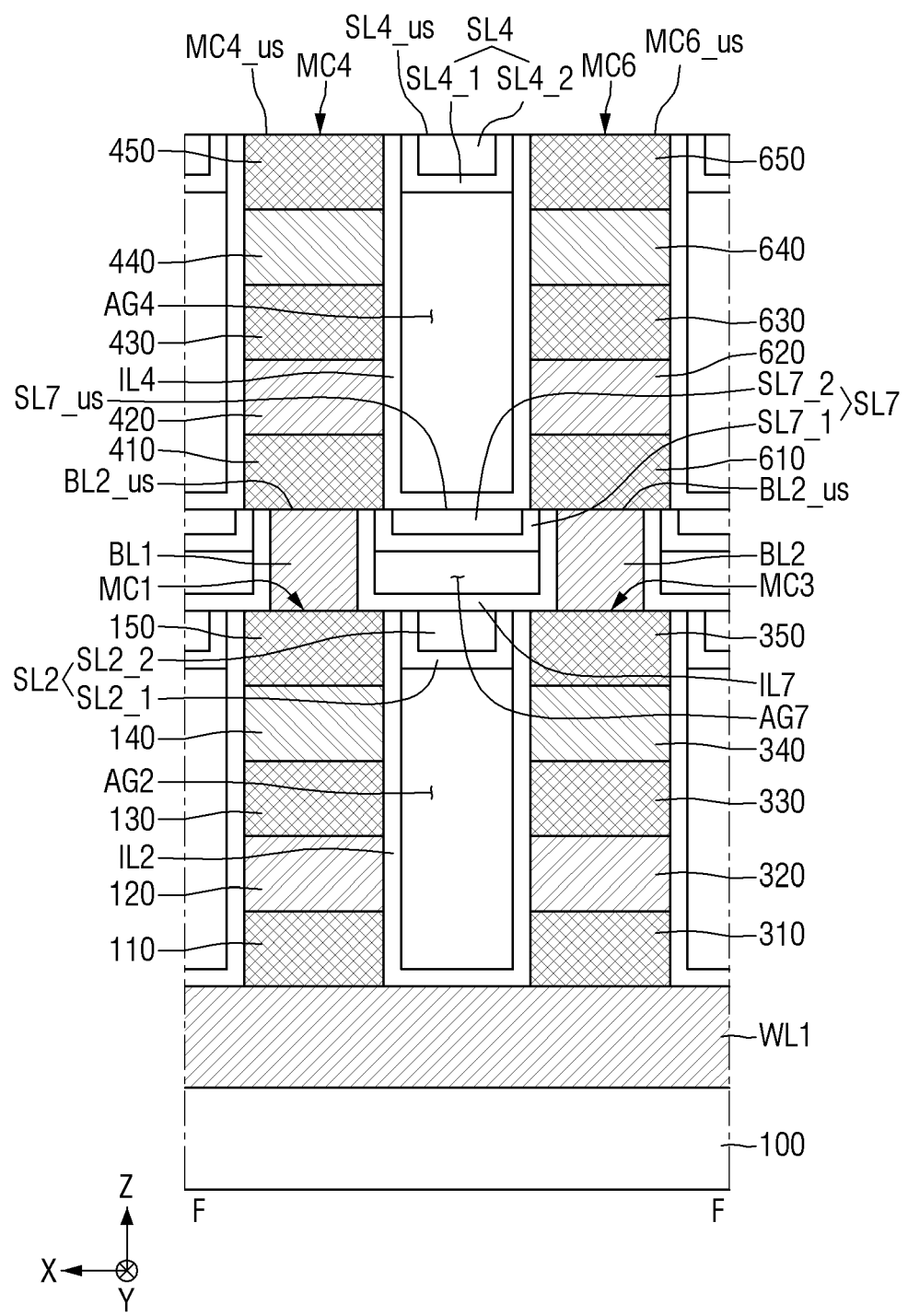

Referring to FIG. 38, a fourth air gap support layer SL4 may be formed by partially removing the fourth insulating layer IL4, the $(4\_1)^{th}$ air gap support layer SL4_1, and the $(4\_2)^{th}$ air gap support layer SL4_2.

The $(4\_1)^{th}$ air gap support layer SL4_1, the $(4\_2)^{th}$ air gap support layer SL4_2, and the fourth insulating layer IL4 may be removed using a CMP process.

In an implementation, an upper surface SL4_us of the fourth air gap support layer SL4 may lie in substantially the same plane as an upper surface MC4_us of the fourth memory cell MC4 and an upper surface MC6_us of the sixth memory cell MC6.

Referring to FIGS. 36 through 38, the fourth air gap AG4 may be formed after the $(4\_2)^{th}$ air gap support layer SL4_2 is formed. In an implementation, it may be formed after the $(4\_1)^{th}$ air gap support layer SL4_1 is formed or may be formed after the fourth air gap support layer SL4 is formed.

Figure 39:
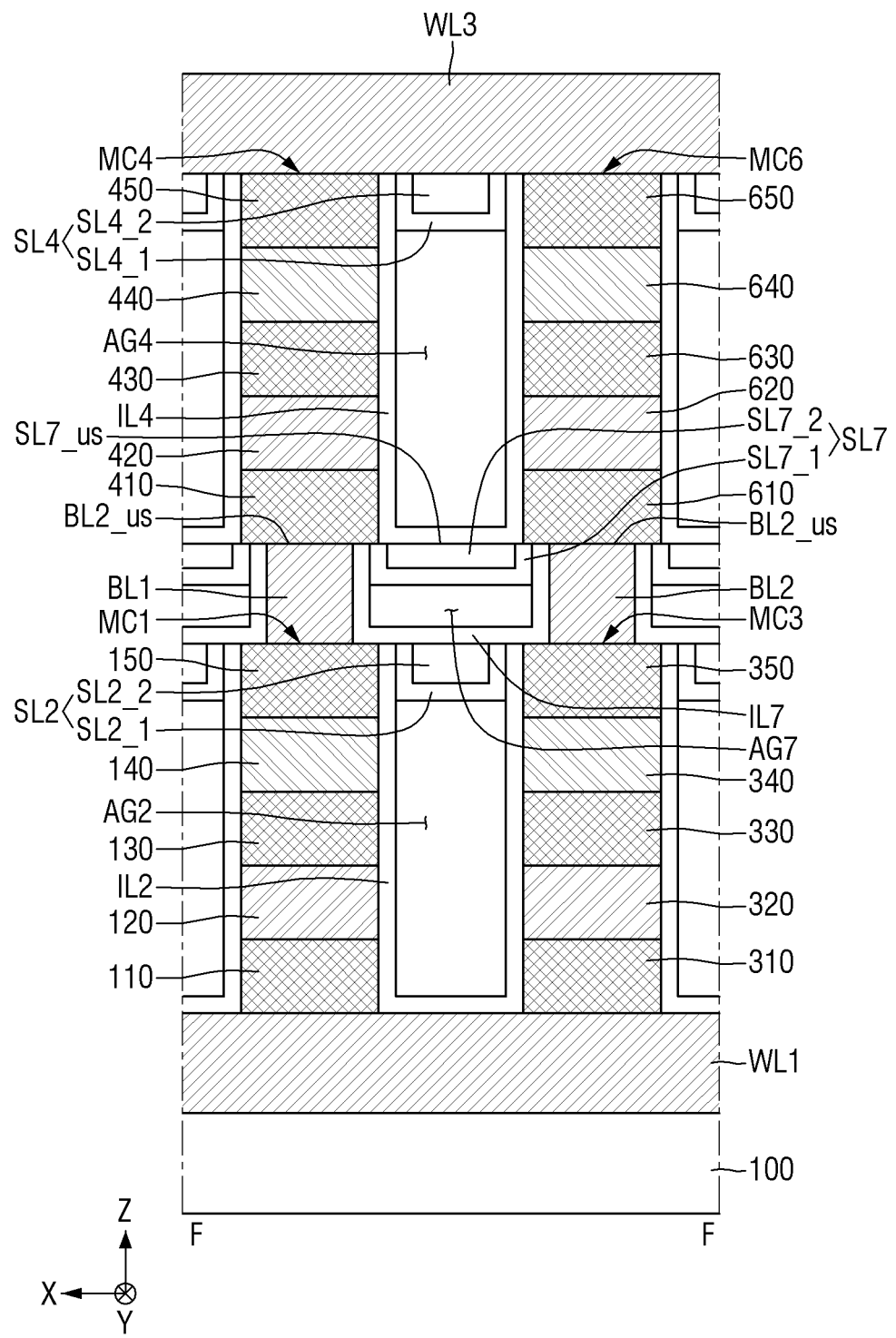

Referring to FIG. 39, a first upper conductive line WL3 may be formed on the fourth memory cell MC4 and the sixth memory cell MC6. In an implementation, a second upper conductive line WL4 spaced apart from the first upper conductive line WL3 in the second direction Y may be formed.

In an implementation, a sixth air gap (e.g., AG6 of FIG. 2C) may be formed between the first upper conductive line WL3 and the second upper conductive line WL4. The process of forming the sixth air gap may be the same as the process of forming the fifth air gap (e.g., AG5 of FIG. 2C).

One or more embodiments may provide a semiconductor memory device including an air gap that electrically insulates word lines, bit lines, or memory cells.

One or more embodiments may provide a semiconductor memory device with improved performance and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    a first lower conductive line and a second lower conductive line each extending in a first direction and being spaced apart from each other in a second direction intersecting the first direction;
    a first middle conductive line on the first lower conductive line and the second lower conductive line and extending in the second direction;
    a first memory cell between the first lower conductive line and the first middle conductive line;
    a second memory cell between the second lower conductive line and the first middle conductive line;
    an air gap support layer between the first memory cell and the second memory cell; and
    a first air gap between the first memory cell and the second memory cell and under the air gap support layer,
    wherein:
    an upper surface of the air gap support layer lies in a same plane as an upper surface of the first memory cell and an upper surface of the second memory cell,
    the first memory cell includes a first ovonic threshold switching (OTS) layer and a first phase-change layer,
    the second memory cell includes a second OTS layer and a second phase-change layer, and
    the first air gap overlaps the first phase-change layer and the second phase-change layer in the second direction.

2. The semiconductor memory device as claimed in claim 1, wherein:
    the first memory cell includes a first upper electrode between the first phase-change layer and the first middle conductive line, and
    at least a part of sidewalls of the first upper electrode overlaps the air gap support layer in the second direction.

3. The semiconductor memory device as claimed in claim 1, further comprising an insulating layer between the first air gap and the first memory cell.

4. The semiconductor memory device as claimed in claim 3, wherein sidewalls of the insulating layer overlap the first OTS layer in the second direction.

5. The semiconductor memory device as claimed in claim 1, further comprising:
    a second middle conductive line extending in the second direction and being spaced apart from the first middle conductive line in the first direction;
    a third memory cell between the first lower conductive line and the second middle conductive line; and
    a second air gap between the first memory cell and the third memory cell.

6. The semiconductor memory device as claimed in claim 5, wherein the second air gap overlaps the first phase-change layer in the first direction.

7. The semiconductor memory device as claimed in claim 1, wherein the air gap support layer includes:
    a first air gap support layer along profiles of the first air gap and the first and second memory cells, and
    a second air gap support layer on the first air gap support layer.

8. The semiconductor memory device as claimed in claim 7, wherein the first air gap support layer and the second air gap support layer are made of different materials.

9. The semiconductor memory device as claimed in claim 1, wherein:
    the first memory cell includes a first lower electrode, a first middle electrode on the first lower electrode, and a first upper electrode on the first middle electrode, the first lower electrode contacts the first lower conductive line, the first middle electrode is between the first OTS layer and the first phase-change layer, and the first upper electrode contacts the first middle conductive line.

10. The semiconductor memory device as claimed in claim 1, further comprising:

a fourth memory cell on the first middle conductive line;

a first upper conductive line on the fourth memory cell and extending in the first direction; and a second upper conductive line extending in the first direction and being spaced apart from the first upper conductive line in the second direction.

11. The semiconductor memory device as claimed in claim 10, further comprising:

a fifth memory cell apart from the fourth memory cell in the second direction; and a third air gap between the fourth memory cell and the fifth memory cell.

12. The semiconductor memory device as claimed in claim 10, further comprising:

a sixth memory cell spaced apart from the fourth memory cell in the first direction; and a fourth air gap between the fourth memory cell and the sixth memory cell.

13. A semiconductor memory device, comprising:

a first lower conductive line and a second lower conductive line each extending in a first direction and being spaced apart from each other in a second direction intersecting the first direction;

a first middle conductive line and a second middle conductive line on the first lower conductive line and the second lower conductive line, the first middle conductive line and the second middle conductive line each extending in the second direction and being spaced apart from each other in the first direction;

a first memory cell between the first lower conductive line and the first middle conductive line;

a second memory cell between the second lower conductive line and the first middle conductive line;

a first air gap support layer between the first memory cell and the second memory cell;

a first air gap between the first memory cell and the second memory cell and under the first air gap support layer;

a second air gap between the first lower conductive line and the second lower conductive line; and a third air gap between the first middle conductive line and the second middle conductive line, wherein:

an upper surface of the first air gap support layer lies in a same plane as an upper surface of the first memory cell and an upper surface of the second memory cell, the first memory cell includes a first ovonic threshold switching (OTS) layer and a first phase-change layer, the second memory cell includes a second OTS layer and a second phase-change layer, and the first air gap overlaps the first and second phase-change layers in the second direction.

14. The semiconductor memory device as claimed in claim 13, wherein:

the first memory cell includes a first upper electrode between the first phase-change layer and the first middle conductive line, and at least a part of sidewalls of the first upper electrode overlaps the first air gap support layer in the second direction.

15. The semiconductor memory device as claimed in claim 13, further comprising:

a second air gap support layer on the second air gap; and a third air gap support layer on the third air gap.

16. The semiconductor memory device as claimed in claim 15, wherein:

an upper surface of the second air gap support layer and an upper surface of the first lower conductive line lie in a same plane, and an upper surface of the third air gap support layer and an upper surface of the first middle conductive line lie in a same plane.

17. The semiconductor memory device as claimed in claim 13, wherein the first air gap support layer includes:

a first air gap support sub-layer along profiles of the first air gap, the first memory cell, and the second memory cell, and a second air gap support sub-layer on the first air gap support sub-layer.

18. The semiconductor memory device as claimed in claim 17, wherein the first air gap support sub-layer and the second air gap support sub-layer are different materials.

* * * * *